(12) United States Patent
Song

(10) Patent No.: US 10,989,369 B2
(45) Date of Patent: Apr. 27, 2021

(54) LIGHTING APPARATUS USING ORGANIC LIGHT EMITTING DIODE AND MANUFACTURING METHOD THEREOF

(71) Applicant: LG Display Co., Ltd., Seoul (KR)

(72) Inventor: TaeJoon Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/514,652

(22) Filed: Jul. 17, 2019

(65) Prior Publication Data
US 2020/0032967 A1 Jan. 30, 2020

(30) Foreign Application Priority Data
Jul. 25, 2018 (KR) .................. 10-2018-0086403

(51) Int. Cl.
| | |
|---|---|
| *F21K 9/90* | (2016.01) |
| *H01L 33/00* | (2010.01) |
| *H01L 51/50* | (2006.01) |
| *H01L 51/52* | (2006.01) |
| *F21Y 115/15* | (2016.01) |

(52) U.S. Cl.
CPC ............ *F21K 9/90* (2013.01); *H01L 33/0037* (2013.01); *H01L 51/5012* (2013.01); *F21Y 2115/15* (2016.08); *H01L 51/5206* (2013.01); *H01L 51/5221* (2013.01)

(58) Field of Classification Search
CPC ... F21K 9/90; H01L 33/0037; H01L 51/5012; H01L 51/5206; H01L 51/5221
See application file for complete search history.

(56) References Cited

U.S. PATENT DOCUMENTS

| | | | |
|---|---|---|---|
| 2014/0159003 A1* | 6/2014 | Shin | H01L 51/5246 257/40 |
| 2016/0126498 A1* | 5/2016 | Kim | H01L 51/5234 257/40 |

FOREIGN PATENT DOCUMENTS

| | | |
|---|---|---|
| KR | 10-2005-0064353 A | 6/2005 |
| KR | 10-2011-0079500 A | 7/2011 |

\* cited by examiner

*Primary Examiner* — Anne M Hines
(74) *Attorney, Agent, or Firm* — Polsinelli PC

(57) ABSTRACT

A lighting apparatus using an organic light emitting diode that has a first area and a second area, the lighting apparatus comprises a substrate; an auxiliary line disposed in the first area on the substrate; a plurality of barrier layers disposed in the second area on the substrate; a first electrode disposed on the auxiliary line and the plurality of barrier layers; an organic layer disposed on the first electrode; and a second electrode disposed on the organic layer.

12 Claims, 29 Drawing Sheets

LIGHTING APPARATUS USING ORGANIC LIGHT EMITTING DIODE AND MANUFACTURING METHOD THEREOF

CROSS-REFERENCE TO RELATED APPLICATION

This application claims the priority of Korean Patent Application No. 10-2018-0086403 filed on Jul. 25, 2018, in the Korean Intellectual Property Office, the disclosure of which is incorporated herein by reference.

BACKGROUND

Field of the Disclosure

The present disclosure relates to a lighting apparatus using an organic light emitting diode and a manufacturing method thereof, and more particularly, to a lighting apparatus using an organic light emitting diode with improved reliability.

Description of the Background

Currently, fluorescent lamps or incandescent lamps are mainly used as lighting apparatuses. Among them, the incandescent lamps have a good color rendering index (CRI), but have very low energy efficiency. Further, the fluorescent lamps have good efficiency, but have a low color rendering index and contain mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. A CRI of sunlight is 100.

In order to solve the problems of the lighting apparatus of the related art, recently, a light emitting diode (LED) is suggested as a lighting apparatus. The light emitting diode is made of an inorganic light emitting material. Luminous efficiency of the light emitting diode is the highest in the red wavelength range and the luminous efficiency thereof is lowered toward a red wavelength range and a green wavelength range which has the highest visibility. Therefore, there is a disadvantage in that when a red light emitting diode, a green light emitting diode, and a blue light emitting diode are combined to emit white light, the luminous efficiency is lowered.

As another alternative, a lighting apparatus using an organic light emitting diode (OLED) has been developed. The organic light emitting diode is configured by an anode, a plurality of organic layers, and a cathode which are sequentially formed on a substrate.

The plurality of organic layers included in the organic light emitting diode is vulnerable to moisture so that when moisture penetrates onto the organic layer from the outside, cell shrinkage is caused in the organic layer. Therefore, the reliability of the organic light emitting diode is degraded.

SUMMARY

The present disclosure is to provide a lighting apparatus using an organic light emitting diode which suppresses the penetration of moisture from the outside and a manufacturing method thereof.

In addition, the present disclosure is to provide a lighting apparatus using an organic light emitting diode with a simplified structure and a manufacturing method thereof.

Further, the present disclosure is to provide a lighting apparatus using an organic light emitting diode which forms a plurality of barrier layers in an emission area through a lift-off process without adding a mask process and a manufacturing method thereof.

The present disclosure is not limited to the above-mentioned aspects, which are not mentioned above, can be clearly understood by those skilled in the art from the following descriptions.

In order to solve the above-described problems, according to an aspect of the present disclosure, a lighting apparatus using an organic light emitting diode is divided into a first area and a second area and includes: a substrate; an auxiliary line disposed in a first area on the substrate; a plurality of barrier layers disposed in a second area on the substrate; a first electrode disposed on an entire surface of the substrate on which the auxiliary line and the plurality of barrier layers are disposed; and an organic layer disposed on the first electrode and a second electrode disposed on the organic layer. Therefore, the reliability of the lighting apparatus may be improved.

In order to solve the above-described problems, according to another aspect of the present disclosure, a manufacturing method of a lighting apparatus using an organic light emitting diode includes: providing a substrate which is divided into a first area and a second area; forming an auxiliary line and a photosensitive film pattern in the first area on the substrate; depositing a first inorganic barrier layer on an entire surface of the substrate on which the auxiliary line and the photosensitive film pattern are formed; coating an organic barrier layer in the second area on the substrate on which the first inorganic barrier layer is deposited; depositing a second inorganic barrier layer on an entire surface of the substrate on which the organic barrier layer is coated; lifting-off the first inorganic barrier layer and the second inorganic barrier layer deposited on the photosensitive film pattern by removing the photosensitive film pattern disposed in the first area; forming a first electrode on an entire surface of the substrate on which the auxiliary line, the first inorganic barrier layer, the organic barrier layer, and the second inorganic barrier layer are disposed so as to be in contact with the auxiliary line exposed in the first area; depositing an organic layer on an entire surface of the substrate on which the first electrode is formed; and depositing a second electrode on an entire surface of the substrate on which the organic layer is formed. Therefore, a separate process for disposing the plurality of barrier layers only in the second area is not necessary so that the manufacturing process may be simplified.

Other detailed matters of the exemplary aspects are included in the detailed description and the drawings.

According to the present disclosure, a plurality of barrier layers is disposed in a specific area to suppress the moisture penetration from the outside, thereby improving the reliability of the lighting apparatus.

According to the present disclosure, a separate insulating layer is not disposed on the anode so that a thickness of the lighting apparatus is reduced and flexibility is improved.

According to the present disclosure, only some of the plurality of barrier layers is removed by a lift-off method, so that a separate process for disposing the plurality of barrier layers in an emission area is not necessary and thus the manufacturing process is simplified.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
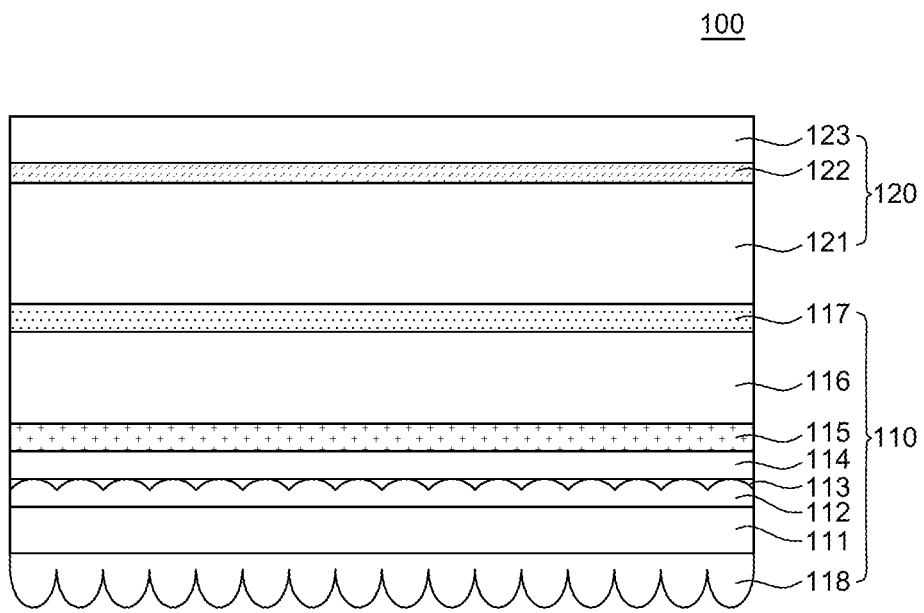
FIG. 1 is a cross-sectional view illustrating a lighting apparatus using an organic light emitting diode according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a lighting apparatus according to exemplary aspects of the present disclosure will be described in detail with reference to accompanying drawings.

FIG. 1 is a cross-sectional view illustrating a lighting apparatus using an organic light emitting diode according to an exemplary aspect of the present disclosure.

In the present disclosure, provided is a lighting apparatus using an organic light emitting diode made of an organic material, rather than a lighting apparatus using an inorganic light emitting diode made of an inorganic material.

Luminous efficiency of green and red of the organic light emitting diode made of an organic light emitting material is relatively better than that of an inorganic light emitting diode. Further, the organic light emitting diode has a relatively wider width of an emission peak of red, green, and blue as compared with the inorganic light emitting diode, so that the color rendering index (CRI) is improved so that the light of the lighting apparatus is more similar to the sunlight.

Referring to FIG. 1, a lighting apparatus 100 using an organic light emitting diode according to an exemplary aspect of the present disclosure includes an organic light emitting diode unit 110 which performs surface emission and an encapsulating unit 120 which encapsulates the organic light emitting diode unit 110.

Specifically, the organic light emitting diode unit 110 may sequentially include a substrate 111, an internal light extracting layer 112, a planarizing layer 113, a barrier layer 114, a first electrode 115, an organic layer 116, and a second electrode 117 from the lower side.

An external light extracting layer 118 for increasing a haze may be additionally provided below the organic light emitting diode unit 110. However, the present disclosure is not limited thereto and the lighting apparatus 100 of the present disclosure may not include the external light extracting layer. Here, the external light extracting layer 118 is configured such that scattering particles such as $TiO_2$ are dispersed in a resin and may be attached below a substrate 111 by means of an adhesive layer (not illustrated).

In addition, as it will be described below with reference to FIG. 3B, the organic light emitting diode unit 110 may further include an auxiliary line AL for compensating conductivity of the first electrode 115.

The substrate 111 may be made of a transparent glass. Further, the substrate 111 may be made of a polymer material having flexibility such as polyimide.

Here, the organic layer 116 which emits light and the first electrode 115 and the second electrode 117 which are disposed on and below the organic layer 116 to supply charges to the organic layer 116 form an organic light emitting diode (OLED).

For example, the first electrode 115 may be an anode which supplies holes to the organic layer 116 and the second electrode 117 may be a cathode which supplies electrons to the organic layer 116, but are not limited thereto and the functions of the first electrode 115 and the second electrode 117 may be switched.

Generally, the first electrode 115 may be made of indium tin oxide (ITO) or indium zinc oxide (IZO) which is a transparent metal oxide material having a high work function and good conductivity or a thin metal film to easily inject the holes. Here, a specific example of the thin metal film may be made of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The first electrode 115 may be configured by a single stack or may also be configured by a multi-stack made of the above-mentioned materials.

Further, the second electrode 117 is desirably made of a conductive material having a low work function so as to easily inject electrons to the organic layer 116. A specific example of a material used for the second electrode 117 may be made of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The second electrode 117 may also be configured by the single stack and configured by the multi-stack made of the above-mentioned materials.

The organic layer 116 may be configured by a single stack structure including a red organic light emitting layer EML or formed to have a multi-stack tandem structure including a plurality of red organic light emitting layers EML, or a multi-stack tandem structure including a red-green organic light emitting layer EML and a sky blue organic light emitting layer EML.

Further, the organic layer 116 may include an electron injection layer EIL and a hole injection layer HIL which inject electrons and holes to the organic light emitting layer EML, respectively, and an electron transport layer ETL and a hole transport layer HTL which transport the injected electrons and holes to the light emitting layer, respectively, and a charge generating layer CGL which generates charges such as the electrons and the holes. A specific structure thereof will be described below with reference to FIGS. 2A to 2C.

When a current is applied to the first electrode 115 and the second electrode 117, the electrons are injected from the second electrode 117 to the organic layer 116 and holes are injected from the first electrode 115 to the organic layer 116. Thereafter, excitons are generated in the organic layer 116. As the excitons are decayed, light corresponding to an energy difference of a lowest unoccupied molecular orbital (LUMO) and a highest occupied molecular orbital (HOMO) of the light emitting layer is generated.

Here, it is determined whether the light generated in the organic layer 116 is emitted to the front surface or to the rear surface depending on transmittance and reflectance of the first electrode 115 and the second electrode 117.

In the exemplary aspect of the present disclosure, as described above, the first electrode 115 is a transparent electrode and the second electrode 117 is used as a reflective electrode. Therefore, the light emitted from the organic layer 116 is reflected by the second electrode 117 to be transmitted through the first electrode 115 so that the light is generated to the lower portion of the organic light emitting diode unit 110. That is, the organic light emitting diode unit 110 according to an exemplary aspect of the present disclosure may perform bottom emission. However, the present disclosure is not limited thereto and the first electrode 115 is used as a reflective electrode and the second electrode 117 is used as a transparent electrode so that the organic light emitting diode unit 110 may perform top emission.

Further, the barrier layer 114 is disposed below the first electrode 115 to block moisture, air, or fine particles penetrating from the substrate 111 and the internal light extracting layer 112.

In order to suppress the penetration of moisture and air, the barrier layer 114 may include a plurality of inorganic barrier layers and in order to block the fine particles, the barrier layer 114 may include a plurality of organic barrier layers.

Specifically, as it will be described below with reference to FIG. 4, the barrier layer 114 according to the present disclosure may be disposed only in an area between auxiliary lines AL, that is, a second area A2 which is an emission area, excluding an area where the auxiliary lines AL are disposed, that is, the first area A1 which is a non-emission area. A first inorganic barrier layer 114a, an organic barrier layer 114b, and a second inorganic barrier layer 114C are sequentially laminated and the first inorganic barrier layer 114a and the second inorganic barrier layer 114c may be formed so as to surround the organic barrier layer 114b. Details thereof will be described below with reference to FIG. 4.

The internal light extracting layer 112 is disposed between the substrate 111 and the barrier layer 114 to increase the external extracting efficiency of the light generated from the organic light emitting diode which performs the bottom emission.

The internal light extracting layer 112 inserts titanium oxide $TiO_2$ particles into resin to increase internal light scattering and increase surface roughness, thereby increasing optical extraction efficiency. Specifically, the internal light extracting layer 112 may be formed to have a thickness of 450 nm by an inkjet-coating method and a diameter of titanium oxide $TiO_2$ particle may be 200 nm to 300 nm. However, the specific value may vary to various values depending on the necessity of the design of the lighting apparatus 100.

The planarizing layer 113 is disposed on the internal light extracting layer 112 to compensate the surface roughness of the internal light extracting layer 112, thereby improving the reliability of the organic light emitting diode unit 110.

The planarizing layer 113 is configured by inserting zirconia particles into resin and compensates the surface roughness of the internal light extracting layer 112. Specifically, the planarizing layer 113 may be formed by the inkjet-coating method to have a thickness of 150 nm and a diameter of the zirconia particle may be 50 nm. However, the specific value may vary to various values depending on the necessity of the design of the lighting apparatus 100.

The encapsulating unit 120 covers the organic light emitting diode unit 110 to protect the organic light emitting diode unit 110 by blocking the influence from the outside. The encapsulating unit 120 includes an adhesive layer 121 which is in contact with the second electrode 117, a metal film 122 which is in contact with the adhesive layer 121, and a protective film 123 attached onto the metal film 122.

The adhesive layer 121 may be made of a pressure sensitive adhesive (PSA) which bonds the metal film 122 and the organic light emitting diode unit 110. A thickness of the adhesive layer 121 may be 30 □m, but is not limited thereto and may vary to various values depending on the necessity of the design of the lighting apparatus 100.

The metal film 122 is disposed on the adhesive layer 121 to maintain the rigidity of the lighting apparatus 100. To this end, the metal film 122 may be made of copper (Cu) having a thickness of 20 □m, but is not limited thereto and may vary in various forms depending on the necessity of the design of the lighting apparatus 100.

The protective film 123 is disposed on the metal film 122 to absorb the external impact of the lighting apparatus 100 and protect the lighting apparatus 100. To this end, the protective film 123 may be made of a polyethylene terephthalate (PET) film which is a polymer film having a thickness of 100 μm, but is not limited thereto and may vary in various forms depending on the necessity of the design of the lighting apparatus 100.

Figure 2A:
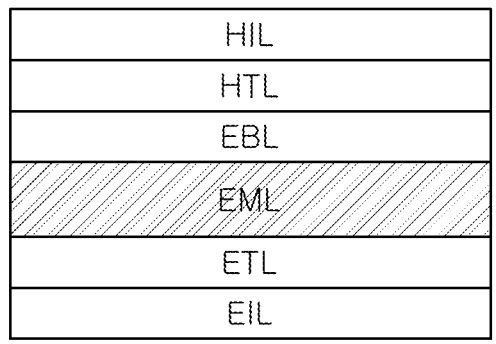
FIGS. 2A to 2C are cross-sectional views illustrating a stack structure of an organic layer according to an exemplary aspect of the present disclosure.
Figure 2B:
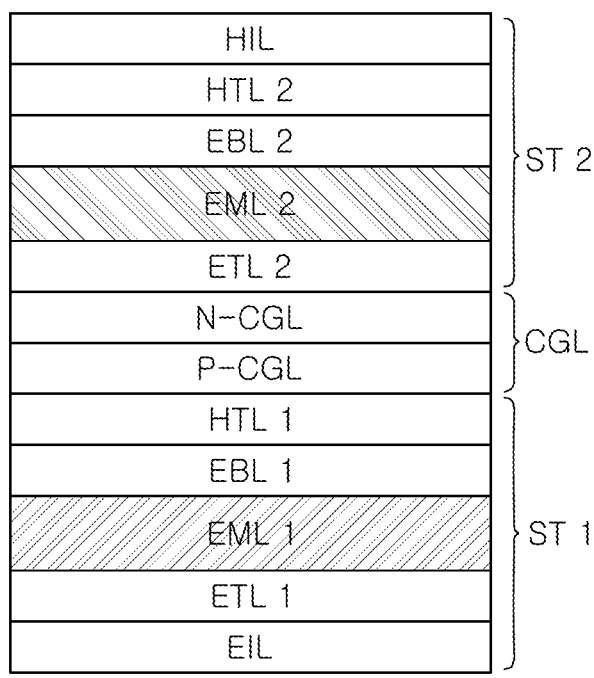
Figure 2C:
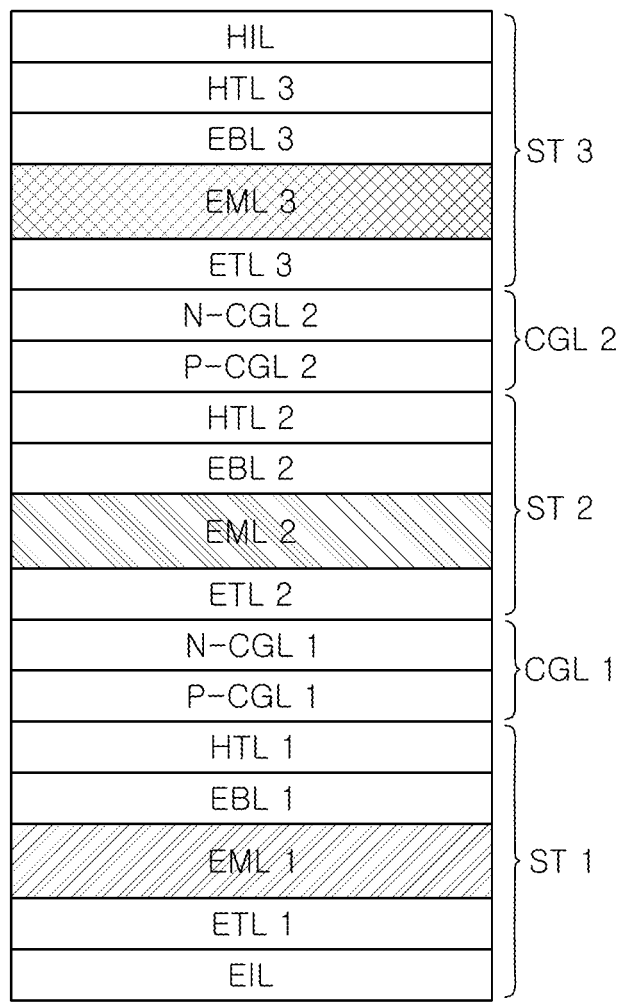

FIGS. 2A to 2C are cross-sectional views illustrating a stack structure of an organic layer according to an exemplary aspect of the present disclosure.

Specifically, FIG. 2A illustrates an organic layer 116 having a single stack, FIG. 2B illustrates an organic layer 116 having a tandem structure including a double stack, and FIG. 2C illustrates an organic layer 116 having a tandem structure including a triple stack.

Referring to FIG. 2A, the organic layer 116 is configured by a hole injection layer (HIL), a hole transport layer (HTL), an electron blocking layer (EBL), an organic light emitting layer (EML), an electron transport layer (ETL), and an electron injection layer (EIL) which are sequentially laminated.

The hole injection layer HIL is an organic layer which smoothly injects the hole from the first electrode 115 to the organic light emitting layer EML. The hole injection layer HIL may be made of a material including any one or more of HAT-CN (dipyrazino[2,3-f:2',3'-h]quinoxaline-2,3,6,7, 10.11-hexacarbonitrile), CuPc (phthalocyanine), F4-TCNQ (2,3,5,6-tetrafluoro-7,7,8,8-tetracyano-quinodimethane), and NPD (N,N'-bis(naphthalene-1-yl)-N,N'-bis(phenyl)-2, 2'-dimethylbenzidine), but is not limited thereto.

The hole transport layer HTL is an organic layer which smoothly transmits the holes from the hole injection layer HIL to the organic light emitting layer EML. For example, the hole transport layer HTL may be made of a material including any one or more of NPD (N,N'-bis(naphthalene-1-yl)-N,N'-bis(phenyl)-2,2'-dimethylbenzidine), TPD (N,N'-bis-(3-methylphenyl)-N,N'-bis-(phenyl)-benzidine), s-TAD (2,2',7,7'-tetrakis(N,N-dimethylamino)-9,9-spirofluorene), and MTDATA (4,4',4"-Tris(N-3-methylphenyl-N-phenyl-amino)-triphenylamine), but is not limited thereto.

The electron blocking layer EBL is an organic layer which blocks the electron injected into the organic light emitting layer EML from crossing over the hole transport layer HTL. The electron blocking layer EBL blocks the movement of the electron to improve the combination of the hole and the electron in the organic light emitting layer EML and improve luminous efficiency of the organic light emitting layer EML. Even though the electron blocking layer EBL may be made of the same material as the hole transport layer HTL and the hole transport layer HTL and the electron blocking layer EBL may be formed as different layers, it is not limited thereto. The hole transport layer HTL and the electron blocking layer EBL may be combined.

In the organic light emitting layer EML, the holes supplied through the first electrode 115 and the electrons supplied through the second electrode 117 are recombined to generate excitons. Here, an area where the excitons are generated is referred to as an emission area (or emission zone) or a recombination zone.

The organic light emitting layer (EML) is disposed between the hole transport layer HTL and the electron transport layer ETL and includes a material which emits light having a specific color. In this case, the organic light emitting layer EML may include a material which emits red light.

The organic light emitting layer EML may have a host-dopant system, that is, a system in which a host material having a large weight ratio is doped with an emission dopant material having a small weight ratio.

In this case, the organic light emitting layer EML may include a plurality of host materials or include a single host material. The organic light emitting layer EML including a plurality of host materials or a single host material is doped with a red phosphorescent dopant material. That is, the organic light emitting layer EML is a red light emitting layer and a range of a wavelength of light emitted from the organic light emitting layer EML may be 600 nm to 660 nm.

The red phosphorescent dopant material is a material which is capable of emitting red light. An EL spectrum of light emitted from the organic light emitting layer EML doped with the red phosphorescent dopant material has a peak in a red wavelength area or has a peak in a wavelength region corresponding to red.

The red phosphorescent dopant material may be made of a material including any one or more of a iridium (Ir) ligand complex including Ir(ppy)3(factris(2-phenylpyridine) iridium)(tris(2-phenylpyridine)iridium), PIQIr(acac)(bis(1-phenylisoquinoline) acetylacetonate iridium), PQIr(acac) (bis(1-phenylquinoline) acetylacetonate iridium), PQIr(tris (1-phenylquinoline) iridium) Ir(piq)3 (tris(1-phenylisoquinoline)iridium), Ir(piq)2(acac)(bis(1-phenylisoquinoline)(acetylacetonate)iridium), PtOEP (octaethylporphyrinporphine platinum) PBD:Eu(DBM)3 (Phen), and perylene, but is not limited thereto.

The electron transport layer ETL is supplied with electrons from the electron injection layer EIL. The electron transport layer ETL transmits the supplied electrons to the organic light emitting layer EML.

Further, the electron transport layer ETL performs the same function as a hole blocking layer HBL. The hole blocking layer may suppress the holes which do not participate in the recombination from being leaked from the organic light emitting layer EML.

For example, the electron transport layer ETL may be made of any one or more of Lig (8-hydroxyquinolinolato-lithium), PBD (2-(4-biphenyl)-5-(4-tert-butylphenyl)-1,3,4-oxadiazole), TAZ (3-(4-biphenyl)4-phenyl-5-tert-butylphenyl-1,2,4-triazole), BCP (2,9-Dimethyl-4,7-diphenyl-1,10-phenanthroline), and BAlq (bis(2-methyl-8-quinolinolate)-4-(phenylphenolato)aluminum), but is not limited thereto.

The electron injection layer EIL is a layer which smoothly injects the electron from the second electrode 117 to the organic light emitting layer EML. For example, the electron injection layer EIL may be made of a material including any one or more of alkali metals or alkaline earth metal ion forms such as LiF, BaF2, and CsF, but is not limited thereto.

The electron injection layer EIL and the electron transport layer ETL may be omitted depending on a structure or a characteristic of the lighting apparatus 100 using an organic light emitting diode.

Referring to FIG. 2B, the organic layer 116 includes a first stack ST1 including a first organic light emitting layer EML1, a second stack ST2 including a second organic light emitting layer EML2, and a charge generating layer CGL disposed between the first stack ST1 and the second stack ST2.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, a second hole transport layer HTL2, and a hole injection layer HIL and the function and the configuration of each layer are as described above.

In the meantime, the charge generating layer CGL is disposed between the first stack ST1 and the second stack ST2. The charge generating layer CGL supplies charges to the first stack ST1 and the second stack ST2 to control a charge balance between the first stack ST1 and the second stack ST2.

The charge generating layer CGL includes an N-type charge generating layer N-CGL and a P-type charge generating layer P-CGL. The N-type charge generating layer N-CGL is in contact with the second electron transport layer ETL2 and the P-type charge generating layer P-CGL is disposed between the N-type charge generating layer N-CGL and the first hole transport layer HTL1. The charge generating layer CGL may be configured by a plurality of layers including the N-type charge generating layer N-CGL and the P-type charge generating layer P-CGL, but is not limited thereto and may be configured by a single stack.

The N-type charge generating layer N-CGL injects the electrons to the first stack ST1. The N-type charge generating layer N-CGL may include an N-type dopant material and an N-type host material. The N-type dopant material may be a metal of Group 1 and Group 2 on the periodic table, an organic material which may inject the electrons, or a mixture thereof. For example, the N-type dopant material may be any one of an alkali metal and an alkaline earth metal. That is, the N-type charge generating layer N-CGL may be made of the organic layer 116 doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material may be made of a material which is capable of transmitting electrons, for example, may be made of any one or more of Alq3(tris(8-hydroxyquinolino) aluminum), Liq(8-hydroxyquinolinolato-lithium), PBD (2-(4-biphenylyl)-5-(4-tert-butylphenyl)-1,3,4oxadiazole), TAZ (3-(4-biphenyl)4-phenyl-5-tert-butylphenyl-1,2,4-triazole), spiro-PBD, and BAlq (bis(2-methyl-8-quinolinolate)-4-(phenylphenolato)aluminium), SAlq, TPBi (2,2',2-(1,3,5-benzinetriyl)-tris(1-phenyl-1-H-benzimidazole), oxadiazole, triazole, phenanthroline, benzoxazole, and benzthiazole, but is not limited thereto.

The P-type charge generating layer P-CGL injects the holes to the second stack ST2. The P-type charge generating layer P-CGL may include a P-type dopant material and a P-type host material. The P-type dopant material may be made of metal oxide, an organic material such as tetrafluorotetracyanoquinodimethane (F4-TCNQ), HAT-CN (Hexaazatriphenylene-hexacarbonitrile), or hexaazatriphenylene, or a metal material such as V2O5, MoOx, and WO3, but is not limited thereto. The P-type host material may be made of a material which is capable of transmitting holes, for example, may be made of a material including any one or more of NPD (N,N-dinaphthyl-N,N'-diphenyl benzidine)(N,N'-bis (naphthalene-1-yl)-N,N'-bis(phenyl)-2,2'-dimethylbenzidine), TPD (N,N'-bis-(3-methylphenyl)-N,N'-bis-(phenyl)-benzidine), and MTDATA (4,4',4-Tris(N-3-methylphenyl-N-phenyl-amino)-triphenylamine), but is not limited thereto.

Referring to FIG. 2C, the organic layer 116 includes a first stack ST1 including a first organic light emitting layer EML1, a second stack ST2 including a second organic light emitting layer EML2, a third stack ST3 including a third organic light emitting layer EML3, a first charge generating layer CGL1 disposed between the first stack ST1 and the second stack ST2, and a second charge generating layer CGL2 disposed between the second stack ST2 and the third stack ST3.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, and a second hole transport layer HTL2. The third stack ST3 includes a third electron transport layer ETL3, a third organic light emitting layer EML3, a third electron blocking layer EBL3, a third hole transport layer HTL3, and a hole injection layer HIL. The function and the configuration of each layer are as described above.

The first charge generating layer CGL1 includes a first N-type charge generating layer N-CGL1 and a first P-type charge generating layer P-CGL1 and the first N-type charge generating layer N-CGL1 is in contact with the second electron transport layer ETL2. The first P-type charge generating layer P-CGL1 is disposed between the first N-type charge generating layer N-CGL1 and the first hole transport layer HTL1.

The second charge generating layer CGL2 includes a second N-type charge generating layer N-CGL2 and a second P-type charge generating layer P-CGL2 and the second N-type charge generating layer N-CGL2 is in contact with the third electron transport layer ETL3. The second P-type charge generating layer P-CGL2 is disposed between the second N-type charge generating layer N-CGL2 and the second hole transport layer HTL2. The functions and configurations of the first and second charge generating layers CGL1 and CGL2 are as described above.

Here, the first organic light emitting layer EML1 and the third organic light emitting layer EML3 are red-green organic light emitting layers and a range of a wavelength of light emitted from the first organic light emitting layer EML1 and the third organic light emitting layer EML3 may be 520 nm to 580 nm. The second organic light emitting layer EML2 is a sky blue organic light emitting layer and a range of a wavelength of light emitted from the second organic light emitting layer EML2 may be 450 nm to 480 nm.

Figure 3A:
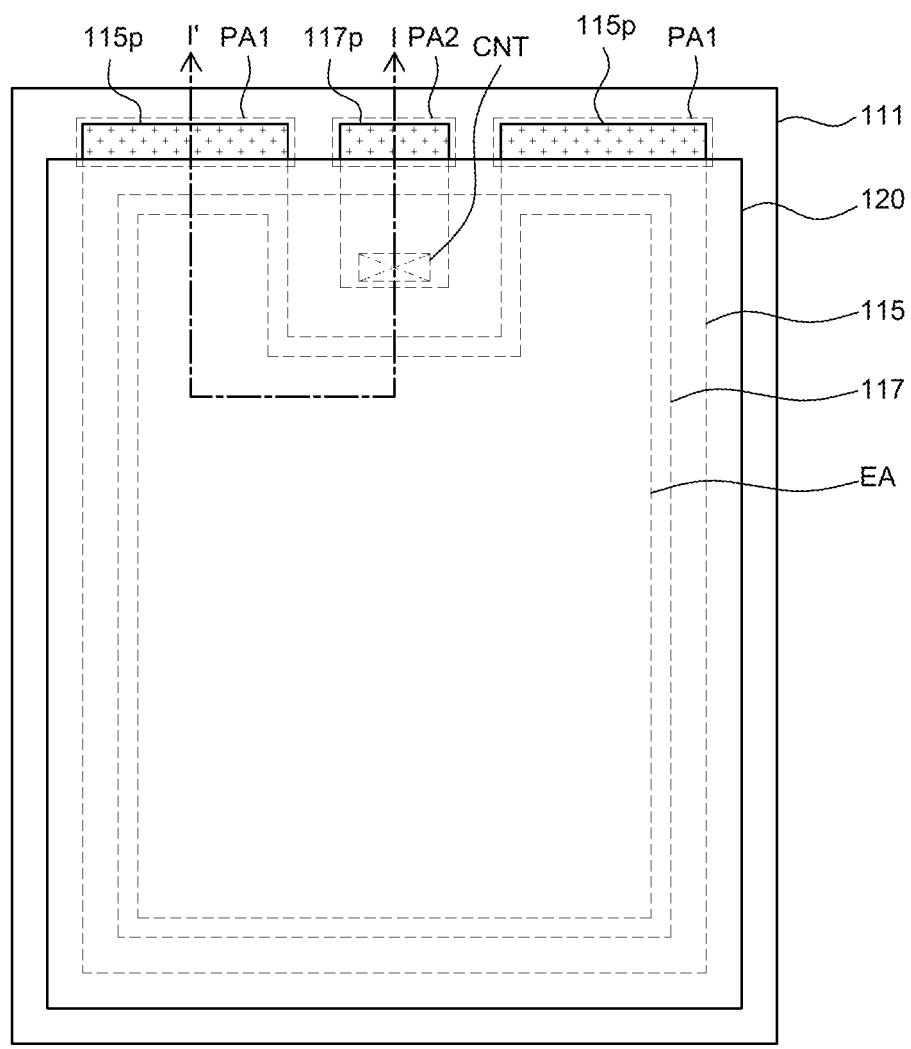
FIG. 3A is a front view of a lighting apparatus using an organic light emitting diode according to an exemplary aspect of the present disclosure.

FIG. 3A is a front view of a lighting apparatus using an organic light emitting diode according to an exemplary aspect of the present disclosure. FIG. 3B is an enlarged view of a lighting unit of a lighting apparatus using an organic light emitting diode according to an exemplary aspect of the present disclosure.

Figure 4:
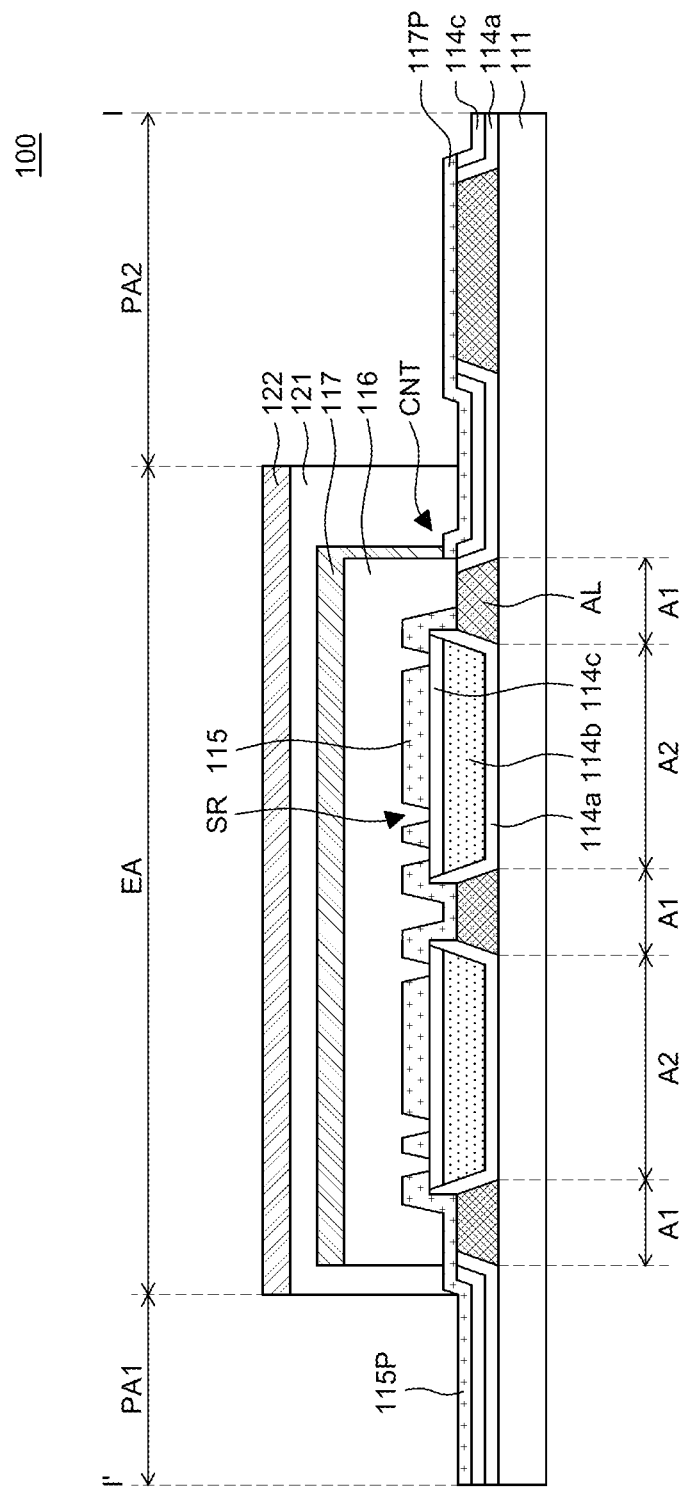
FIG. 4 is a cross-sectional view taken along the line I-I' of FIG. 3A.

FIG. 4 is a cross-sectional view taken along the line I-I' of FIG. 3A.

Specifically, FIG. 3A illustrates an arrangement of the first electrode 115, the second electrode 117, and the encapsulating unit 120. FIG. 4 illustrates not only the connection relationship of the second electrode 117 and the second contact electrode 117p and the connection relationship of the first electrode 115 and the first contact electrode 115p, but also an arrangement of components in the first area A1 and the second area A2.

As illustrated in FIGS. 3A and 4, the first electrode 115 is disposed on the substrate 111, the second electrode 117 is disposed on the first electrode 115, and the encapsulating unit 120 is disposed so as to cover the second electrode 117.

Here, the overlapping area of the first electrode 115 and the second electrode 117 may be defined as a lighting unit EA where light is generated from the organic layer 116 disposed between the first electrode 115 and the second electrode 117.

In other words, the lighting apparatus 100 according to the present disclosure may be divided into a lighting unit EA which actually emits light to the outside and pad units PA1 and PA2 which are electrically connected to the outside through the first and second contact electrodes 115p and 117p to apply a signal to the lighting unit EA.

The pad units PA1 and PA2 are not blocked by the encapsulation unit such as a metal film 122 so that the pad units PA1 and PA2 may be electrically connected to the outside through the first and second contact electrodes 115p and 117p. Therefore, the metal film 122 may be attached onto the entire surface of the lighting unit EA of the substrate 111 excluding the pad units PA1 and PA2. However, the present disclosure is not limited thereto.

That is, in the pad units PA1 and PA2 at the outer edge of the lighting unit EA, the organic layer 116, the second electrode 117, the adhesive layer 121, and the metal film 122 are not formed so that the first and second contact electrodes 115p and 117p are exposed to the outside.

The pad units PA1 and PA2 may be located outside the lighting unit EA. In FIG. 3A, although it is illustrated that the second pad unit PA2 is located between the first pad units PA1, the present disclosure is not limited thereto.

Further, in FIG. 3A, even though it is illustrated that the pad units PA1 and PA2 are located only at one outside of the lighting unit EA, the present disclosure is not limited thereto. Therefore, the pad units PA1 and PA2 of the present disclosure may be disposed in one outside and the other outside of the lighting unit EA. Further, the first pad unit PA1 of the present disclosure may be located at one outside of the lighting unit EA and the second pad unit PA2 may be located at the other outside of the lighting unit EA.

With regard to this, the first contact electrode 115p disposed in the first pad unit PA1 is made of the same material on the same layer as the first electrode 115 disposed in the lighting unit EA. Therefore, the first contact electrode 115p is formed by the same process when the first electrode 115 is formed, to be electrically connected to the first electrode 115.

The second contact electrode 117p disposed in the second pad unit PA2 is made of the same material on the same layer as the first electrode 115 disposed in the lighting unit EA by the same process. However, the second contact electrode 117p is separated from the first electrode 115 and the auxiliary line AL which is electrically connected to the first electrode 115 and is electrically connected to the second electrode 117 through a contact portion CNT.

Therefore, the first contact electrode 115p disposed in the first pad unit PA1 may transmit a signal applied from the outside to the first electrode 115. Further, the second contact electrode 117p disposed in the second pad unit PA2 may transmit the signal applied from the outside to the second electrode 117.

In the meantime, the first electrode 115 is made of a transparent conductive layer to have an advantage in that the emitted light transmits the first electrode, but also have a disadvantage in that an electric resistance is very high as compared with an opaque metal. Therefore, when a large-size lighting apparatus 100 is manufactured, the distribution of the current applied to a large lighting unit EA is not uniform due to high resistance of the transparent high resistive conductive layer. Therefore, the large size lighting apparatus cannot emit light with uniform luminance due to the current distribution which is not uniform.

Figure 3B:
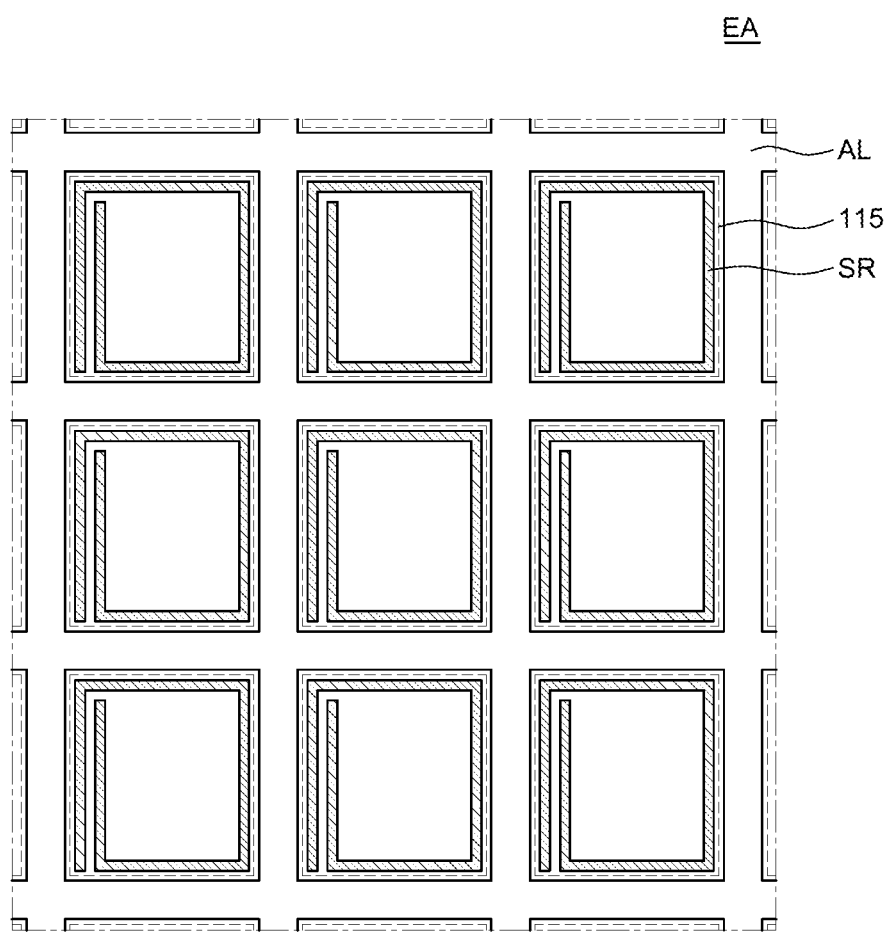
FIG. 3B is an enlarged view of a lighting unit of a lighting apparatus using an organic light emitting diode according to an exemplary aspect of the present disclosure.

Therefore, as illustrated in FIGS. 3B and 4, for the purpose of emission with uniform luminance of the large-size lighting apparatus 100, an auxiliary line AL which is electrically connected to the first electrode 115 which makes the distribution of current applied to the lighting unit EA uniform may be disposed.

The auxiliary line AL is disposed over the entire lighting unit EA with a net shape having a small thickness, a mesh shape, a hexagonal or octagonal shape, or a circular shape. The auxiliary line AL may be made of a metal having a good conductivity such as aluminum (Al), gold (Au), copper (Cu), titanium (Ti), tungsten (W), molybdenum (Mo), or an alloy thereof. Even though not illustrated in the drawing, the auxiliary line AL may be configured to have a double stack structure of an upper auxiliary line AL and a lower auxiliary line AL, but the present disclosure is not limited thereto and the auxiliary line may be configured by a single stack.

Here, in FIG. 4, it is illustrated that the auxiliary line AL which is electrically connected to the first electrode 115 is disposed below the first electrode 115 to be in electrical contact with the first electrode 115. However, the present disclosure is not limited thereto and the auxiliary line AL may be disposed above the first electrode 115.

Further, as illustrated in FIGS. 3B and 4, a short reduction pattern SR is formed in the first electrode 115 to which the current is supplied to form a narrow path and the plurality of organic layers 116 covers the short reduction pattern SR to suppress the short of the entire panel. That is, the short reduction pattern SR is formed to surround an outer edge of the emission area A2 of the individual pixel and adds a resistor to the individual pixels to restrict current flowing in an area where the short is generated.

Hereinafter, a specific stack structure of a lighting apparatus using an organic light emitting diode according to an exemplary aspect of the present disclosure will be described in detail with reference to FIG. 4.

As illustrated in FIG. 4, the lighting apparatus 100 using an organic light emitting diode according to the exemplary aspect of the present disclosure includes an emission area A2 where light generated in the plurality of organic layers 116 is emitted to a lower portion and a non-emission area A1 where light to the lower portion is blocked by an opaque auxiliary line.

Here, as illustrated in FIG. 3B, a plurality of emission areas A2 may be formed to configure individual pixels and the non-emission area A1 may be formed to surround the emission area A2 in a matrix shape.

For the convenience of description, the non-emission area is defined as a first area A1 and the emission area is defined as a second area A2 in the following description.

In the first area A1, an auxiliary line AL is disposed on the substrate 111 and a first electrode 115 is disposed on the auxiliary line AL.

In the second area A2, a plurality of barrier layers 114a, 114b, and 114c is disposed on the substrate 111 and the first electrode 115 is disposed on the plurality of barrier layers 114a, 114b, and 114c.

Here, as described above, in the first electrode 115 disposed in the second area A2, a short reduction pattern SR which implements a narrow path at the outer edge of the second area A2 may be formed. As described above, the short reduction pattern SR is formed to surround an outer edge of the second area A2 which is an emission area of the individual pixels and add a resistor to the individual pixels to restrict current flowing in an area where the short is generated, in the entire panel.

Further, the first electrode 115 formed in the first area A1 and the first electrode 115 disposed in the second area A2 are made of the same material and disposed on the same layer to be electrically connected to each other.

As described above, in the first area A1 and the second area A2, the plurality of organic layers 116, the second electrode 117, the adhesive layer 121, and the metal film 122 may be disposed on the first electrode 115.

Here, the plurality of barrier layers 114a, 114b, and 114c disposed on the substrate 111 of the second area A2 may be configured by a first inorganic barrier layer 114a, an organic barrier layer 114b, and a second inorganic barrier layer 114c which are sequentially laminated from the lower portion.

Specifically, the first inorganic barrier layer 114a and the second inorganic barrier layer 114c may be formed to surround all surfaces including an upper surface, a lower surface, a left surface, and a right surface of the organic barrier layer 114b.

Further, as described above, the first inorganic barrier layer 114a and the second inorganic barrier layer 114c perform a moisture-proofing function and the organic barrier layer 114b serves to block the fine particles. Therefore, the first inorganic barrier layer 114a and the second inorganic barrier layer 114c may be made of one of Al2O3, ZrO2, HfO2, TiO2, ZnO, Y2O3, CeO2, Ta2O5, La2O5, Nb2O5, SiO2, and SiNx which are inorganic insulating materials. Further, the organic barrier layer 114b may be made of acrylic resin or epoxy resin, and specifically may be made of a photoacryl (PAC).

Further, the plurality of barrier layers 114a, 114b, and 114c may use a siloxane based hybrid material made of organic and inorganic components to improve barrier property.

Generally, when the first and second inorganic barrier layers 114a and 114c are thin films formed by a chemical vapor deposition (CVD) method, a thickness is approximately 1000 to 4000 Å. Further, when the first and second inorganic barrier layers are films formed by an atomic layer deposition (ALD) process, a thickness is approximately 300 to 500 Å. In the case of the organic barrier layer 114b, an inkjet process or a slit coater process is used to apply a thickness of 1 to 5 μm. However, the thickness may be reduced or increased to a predetermined level depending on the process or the environment. That is, the thickness of the organic barrier layer 114b may be thicker than each of the thicknesses of the first inorganic barrier layer 114a and the second inorganic barrier layer 114c.

As described above, the auxiliary line AL is disposed in the first area A1 and the plurality of barrier layers 114a, 114b, and 114c is disposed in the second area A2. Further, the first electrode 115 and the plurality of organic layers 116 are disposed in the entire surfaces of the first area A1 and the second area A2 to surround the auxiliary line and the plurality of barrier layers.

Differently from the exemplary aspect of the present disclosure, when the auxiliary line AL is formed after forming the plurality of barrier layers 114a, 114b, and 114c on all surfaces of the first area A1 and the second area A2, a step is formed between the first electrode 115 and the organic layer 116 formed in the first area A1 and the second area A2, respectively. Therefore, the organic layer 116 is damaged due to weak external force so that the first electrode 115 and the second electrode 117 are shorted. In order to solve the above-mentioned problem, an insulating layer may be disposed between the first electrode 115 and the plurality of organic layers 116 to suppress the short of the organic layer 116, which may increase the thickness of the lighting apparatus.

Therefore, in an exemplary aspect of the present disclosure, only the auxiliary line AL is disposed in the first area A1 and only the plurality of barrier layers 114a, 114b, and 114c is disposed in the second area A2. Therefore, the step between the first electrode 115 and the organic layer 116 disposed in the first area A1 and the second area A2 is reduced. To be more specific, a sum of the thicknesses of the plurality of barrier layers 114a, 114b, and 114c is thicker than a thickness of the auxiliary line AL to reduce the step of the first electrode 115 and the organic layer 116. Here, the thickness refers to a stack thickness in a vertical direction.

Therefore, the organic layer 116 is not damaged by the external impact so that the reliability of the lighting apparatus 100 including an organic light emitting diode according to the exemplary aspect of the present disclosure from the external impact may be improved.

Further, since the reliability of the organic layer 116 generated in the first area A1 and the second area A2 is improved, the insulating layer described above for enhancing the reliability is not necessary for the plurality of organic layers 116. Therefore, the thickness of the lighting apparatus 100 including an organic light emitting diode according to an exemplary aspect of the present disclosure is reduced to promote the small thickness. Further, the lighting apparatus 100 becomes thin, so that the flexibility is improved.

Further, the first inorganic barrier layer 114a and the second inorganic barrier layer 114c may be formed to cover all surfaces including an upper surface, a lower surface, a left surface, and a right surface of the organic barrier layer 114b.

That is, the first inorganic barrier layer 114a and the second inorganic barrier layer 114c extend not only in the horizontal direction, but also in the vertical direction so that not only the moisture penetrating from the lower portion, but also the moisture penetrating from the side surface is blocked. Therefore, the lighting apparatus 100 including an organic light emitting diode according to an exemplary aspect of the present disclosure includes not only vertical moisture permeation blocking function but also lateral moisture permeation blocking function from the outside so that the moisture is not applied to the organic layer 116. As a result, cell shrinkage of the organic layer 116 may be suppressed. Therefore, the warpage of the lighting apparatus 100 including an organic light emitting diode is suppressed, to improve the reliability of the lighting apparatus 100.

FIGS. 5A to 5K are plan views sequentially illustrating a manufacturing method of a lighting apparatus using an organic light emitting diode according to an exemplary aspect of the present disclosure illustrated in FIG. 4.

Hereinafter, a lighting apparatus using an organic light emitting diode according to an exemplary aspect of the present disclosure illustrated in FIGS. 1 to 4 will be referred to.

Figure 5A:
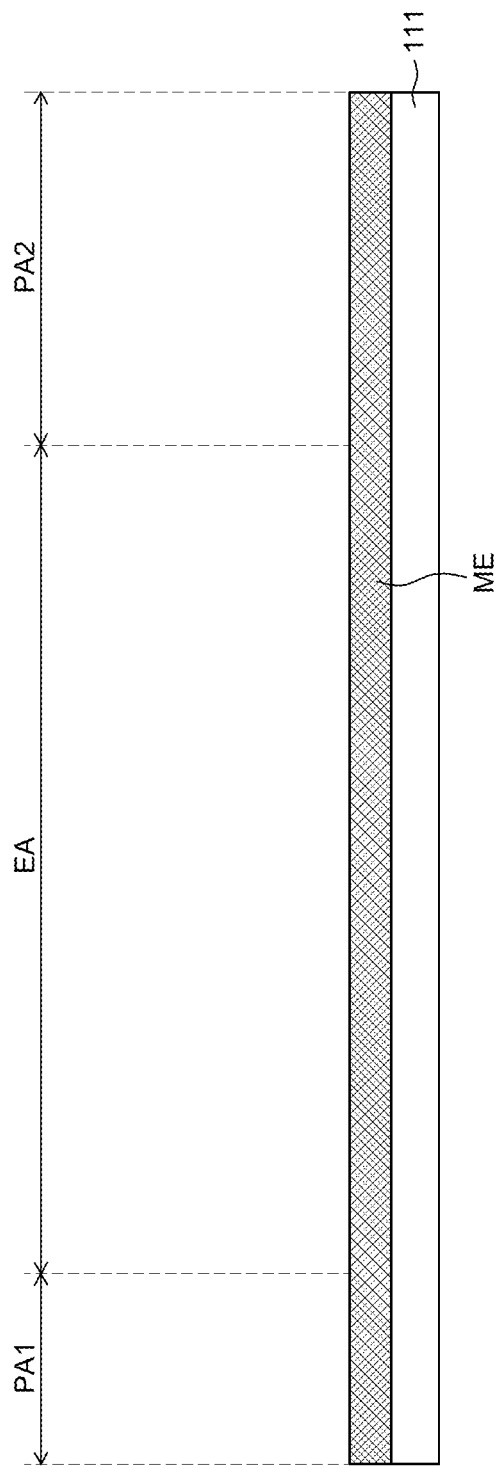
FIGS. 5A to 5K are plan views sequentially illustrating a manufacturing method of a lighting apparatus using an organic light emitting diode according to an exemplary aspect of the present disclosure illustrated in FIG. 4.

Referring to FIG. 5A, a metal film ME may be deposited on the entire surface of the substrate 111 which is divided into the lighting unit EA and the pad units PA1 and PA2.

The substrate 111 may be made of a transparent glass. Further, the substrate 111 may be made of a polymer material having flexibility such as polyimide.

The metal film ME laminated on the substrate 111 may be made of a metal having good conductivity such as aluminum (Al), gold (Au), copper (Cu), titanium (Ti), tungsten (W), molybdenum (Mo), or an alloy thereof. Even though not illustrated, the metal film ME may have a double stack structure, but the present disclosure is not limited thereto and may be configured to have a single stack.

Figure 5B:
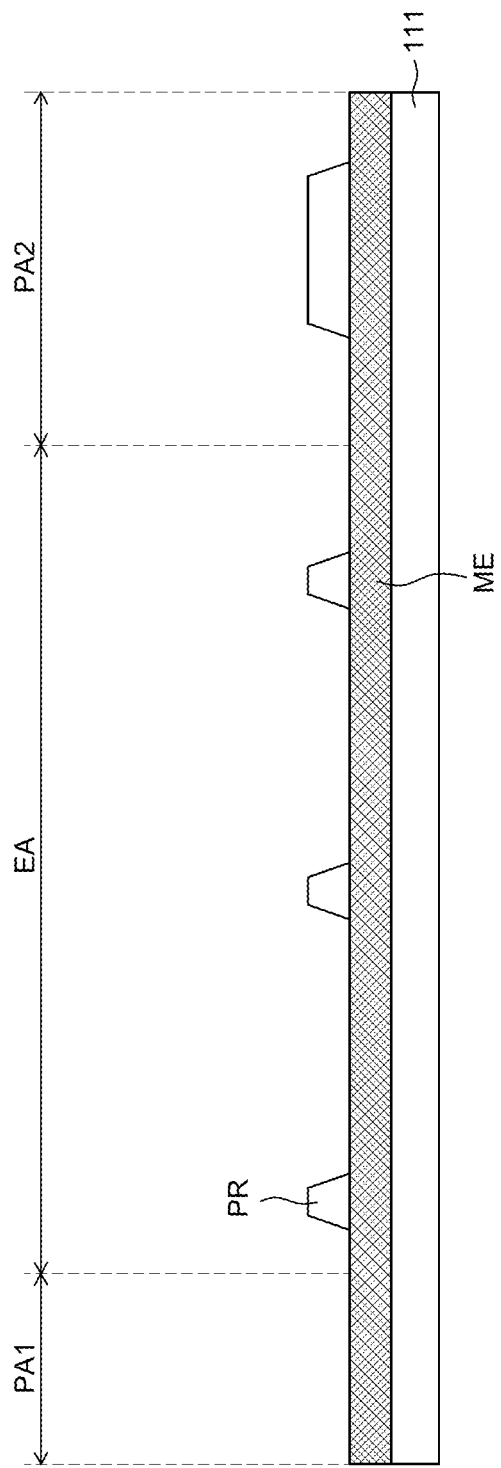
Figure 5C:
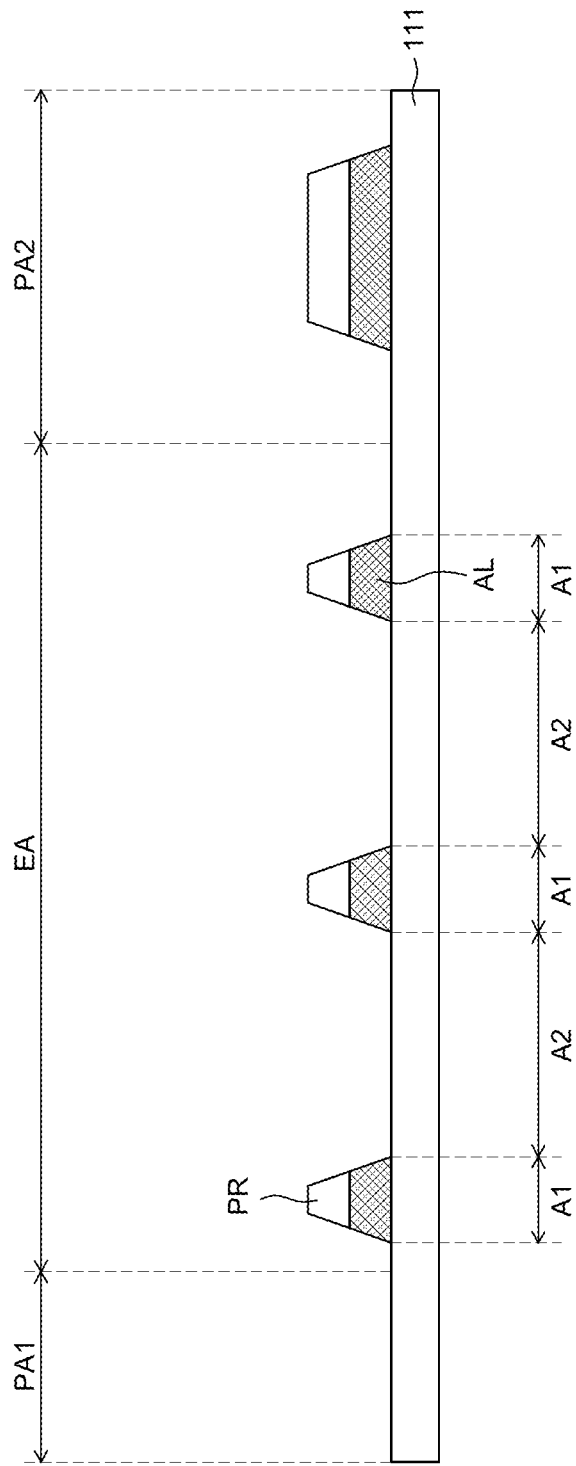

Next, referring to FIGS. 5B and 5C, a photosensitive film pattern PR is formed only on the metal film ME disposed in the first area A1 which is a non-emission area and the metal film ME is etched using the photosensitive film pattern PR as a mask to form the auxiliary line AL in the first area A1.

Here, when the metal film ME is etched using the photosensitive film pattern PR as a mask, various etching methods may be used. However, for the convenience of process, a wet etching method which uses an etchant may be performed.

Figure 5D:
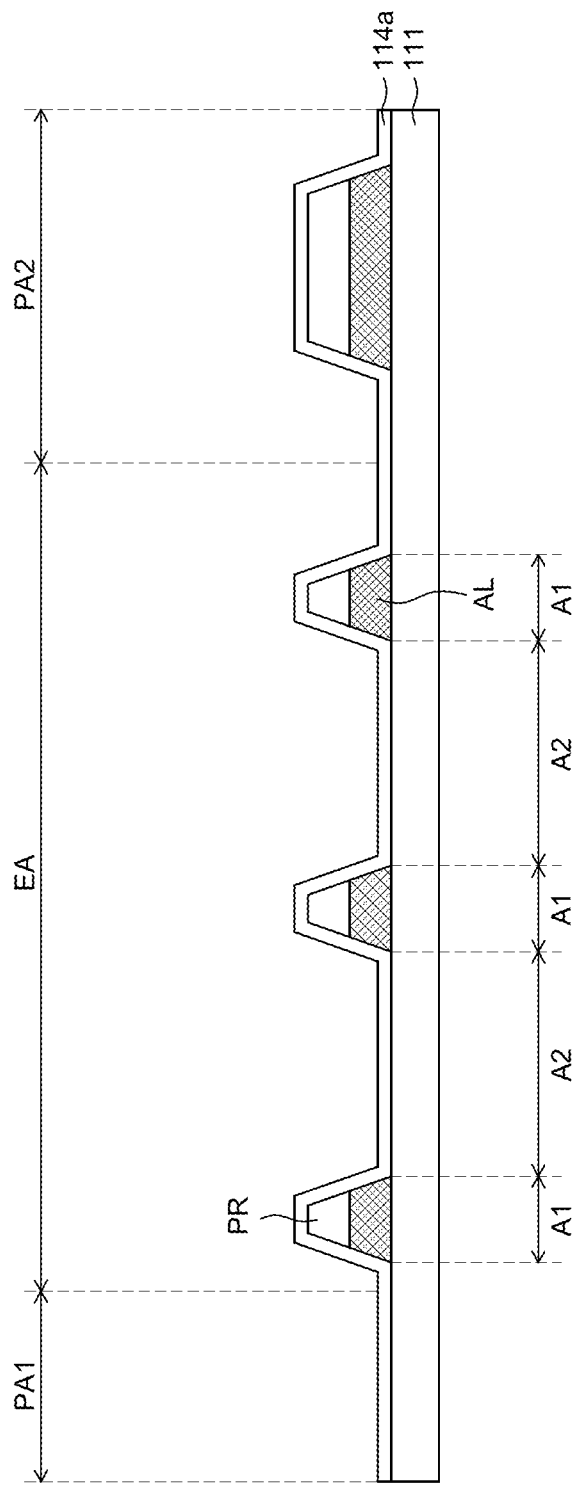

Next, referring to FIG. 5D, the first inorganic barrier layer 114a is deposited on the entire surface of the substrate 111 on which the auxiliary line AL and the photosensitive film pattern PR are formed. Here, the first inorganic barrier layer 114a may be formed by an atomic layer deposition method, but it is not limited thereto and various deposition methods such as a physics vapor deposition method and a chemical vapor deposition method may be used.

Here, the first inorganic barrier layer 114a may be made of one of Al2O3, ZrO2, HfO2, TiO2, ZnO, Y2O3, CeO2, Ta2O5, La2O5, Nb2O5, SiO2, and SiNx which are inorganic insulating materials.

When the first inorganic barrier layer 114a is a thin film formed by a chemical vapor deposition method, the first inorganic barrier layer may be deposited to have a thickness of approximately 1000 to 4000 Å. Further, when the first inorganic barrier layer is a film formed by an atomic layer deposition process, the first inorganic barrier layer may be deposited to have a thickness of approximately 300 to 500 Å. However, the thickness may be reduced or increased to a predetermined level depending on the process or the environment.

Figure 5E:
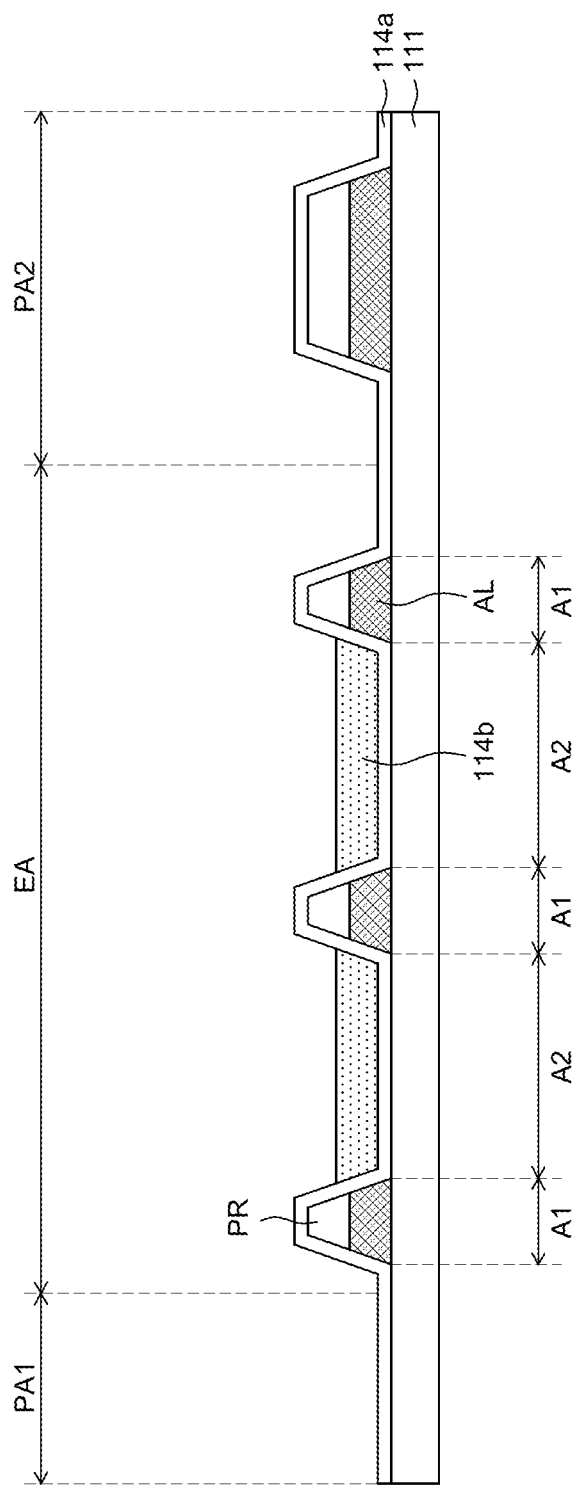

Next, referring to FIG. 5E, the organic barrier layer 114b is coated in the second area A2 on the substrate 111 on which the first inorganic barrier layer 114a is deposited. When the coating method is used, only a desired area may remain using a photo process after coating the entire surface using slit coating method or only an organic film may be formed only in a desired area using an inkjet-coating method.

Here, the organic barrier layer 114b may be made of acrylic resin or epoxy resin, and specifically, may be made of photoacryl (PAC).

The organic barrier layer 114b may be formed to have a thickness of 1 to 5 □m using an inkjet process or a slit coater process and a thickness may be reduced or increased to a predetermined level depending on the process or the environment.

Figure 5F:
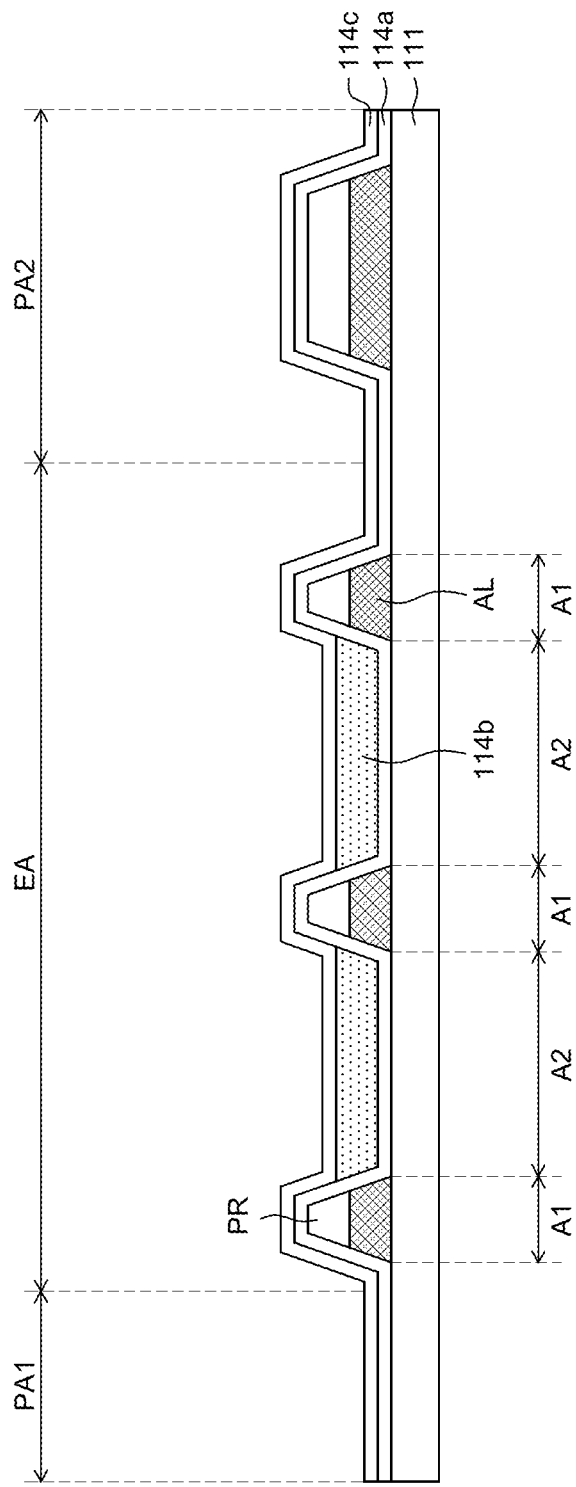

Next, referring to FIG. 5F, the second inorganic barrier layer 114c is deposited on the entire surface of the substrate 111 on which the organic barrier layer 114b is deposited. Here, the second inorganic barrier layer 114c may be formed by the atomic layer deposition method like the deposition of the first inorganic barrier layer 114a, but it is not limited thereto and various deposition methods such as a physics vapor deposition method and a chemical vapor deposition method may be used.

Here, the second inorganic barrier layer 114c may be made of one of Al2O3, ZrO2, HfO2, TiO2, ZnO, Y2O3, CeO2, Ta2O5, La2O5, Nb2O5, SiO2, and SiNx.

When the second inorganic barrier layer 114c is a thin film formed by a chemical vapor deposition method, the second inorganic barrier layer may be deposited to have a thickness of approximately 1000 to 4000 Å. Further, when the second inorganic barrier layer is a film formed by an atomic layer deposition process, the second inorganic barrier layer may be deposited to have a thickness of approximately 300 to 500 Å. However, the thickness may be reduced or increased to a predetermined level depending on the process or the environment.

Figure 5G:
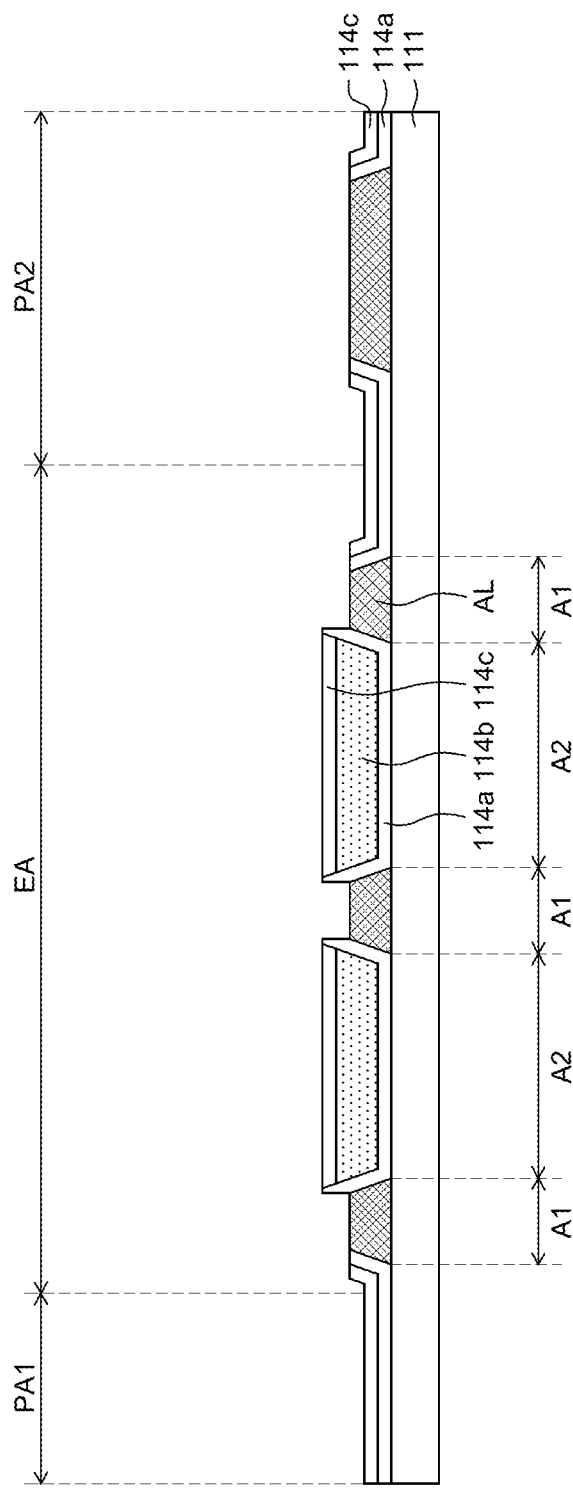

Next, referring to FIG. 5G, the photosensitive film pattern PR disposed in the first area A1 is removed to lift-off the first inorganic barrier layer 114a and the second inorganic barrier layer 114c deposited on the photosensitive film pattern PR.

Specifically, as illustrated in FIG. 5F, in the first area A1, the auxiliary line AL, the photosensitive film pattern PR, the first inorganic barrier layer 114a, and the second inorganic barrier layer 114c are deposited on the substrate 111.

Therefore, when the photosensitive film pattern PR disposed in the first area A1 is removed, the first inorganic barrier layer 114a and the second inorganic barrier layer 114c deposited on the photosensitive film pattern PR are also removed. This method is referred to as a lift-off method.

By doing this, the auxiliary line AL disposed in the first area A1 is exposed to the outside.

Here, there are various methods for removing the photosensitive film pattern PR. However, in the manufacturing method of a lighting apparatus using an organic light emitting diode according to an exemplary aspect of the present disclosure, as a method for removing a photosensitive film pattern PR, intense pulsed light (IPL) is irradiated onto the photosensitive film pattern PR or ultraviolet ray may be irradiated onto the photosensitive film pattern PR including photolysis catalyst after adding the photolysis catalyst to the photosensitive film pattern PR.

Specifically, when intense pulsed light (IPL) is irradiated onto the photosensitive film pattern PR, laser of approximately 360 J is irradiated for 2 ms which is a short time to remove the photosensitive film pattern PR.

The photolysis catalyst may be titanium dioxide TiO2 or cerium stearate and after irradiating the ultraviolet ray onto the photosensitive film pattern PR including photolysis catalyst, the photo-decomposed photosensitive film pattern PR is rinsed or air-blown to be removed.

As described above, the first inorganic barrier layer 114a and the second inorganic barrier layer 114c are removed by a lift-off method so that the first inorganic barrier layer 114a and the second inorganic barrier layer 114c may be patterned only in the second area A2. That is, the first inorganic barrier layer 114a and the second inorganic barrier layer 114c are patterned without using a separate mask process so that it is advantageous because the process is simplified.

Further, the auxiliary line AL is patterned using the photosensitive film pattern PR as a mask and the photosensitive film pattern PR is removed to lift-off the first inorganic barrier layer 114a and the second inorganic barrier layer 114c. Therefore, the auxiliary line AL disposed in the first area A1 and the first inorganic barrier layer 114a and the second inorganic barrier layer 114c disposed in the second area A2 may be self-aligned. Therefore, the patterns of the auxiliary line AL and the first inorganic barrier layer 114a and the second inorganic barrier layer 114c may be more precisely aligned so that the accuracy of the process may be further improved.

Figure 5H:
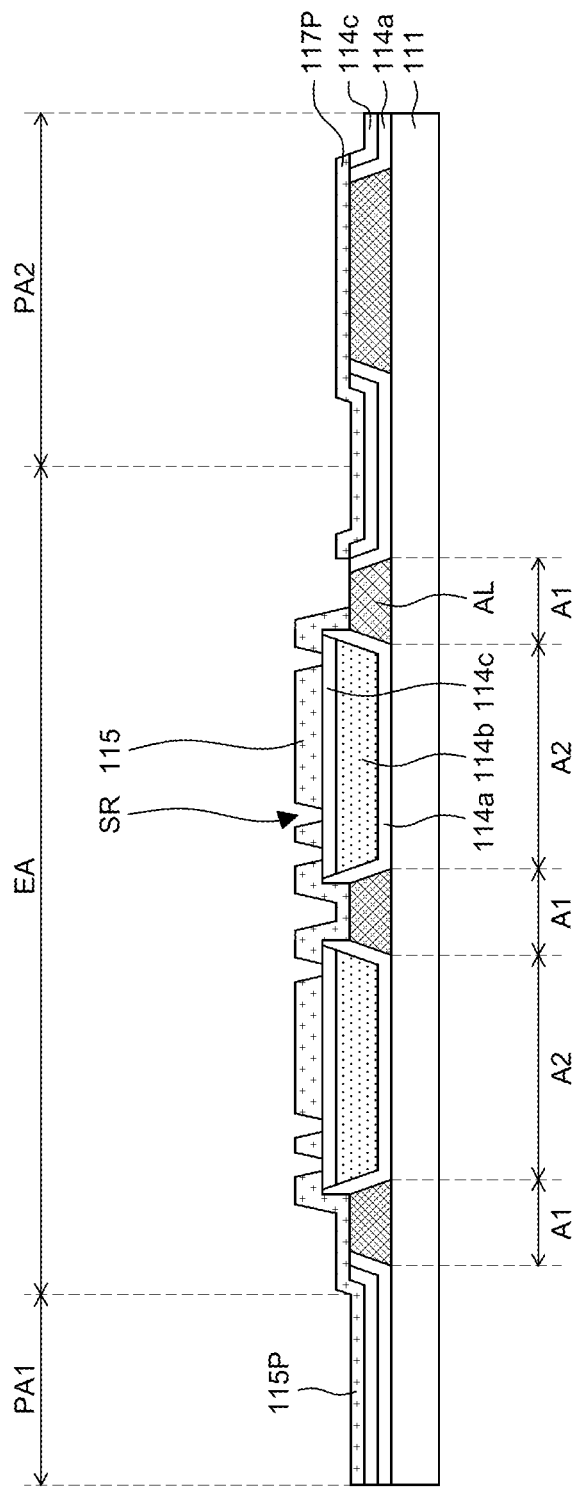

Next, referring to FIG. 5H, an oxide material such as indium tin oxide (ITO) or indium zinc oxide (IZO) or a thin metal film is deposited to be patterned to form the first electrode 115, the first contact electrode 115p, and the second contact electrode 117p.

In other words, the first electrode 115, a first contact electrode 115p, and a second contact electrode 117p may be made of the same material, for example, indium tin oxide (ITO) or indium zinc oxide (IZO) which is an oxide material or a thin metal film, by the same patterning process.

Here, a specific example of the thin metal film may be made of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The first electrode 115 may be configured by a single stack or may also be configured by a multi-stack made of the above-mentioned materials.

Specifically, as described above, in the first electrode 115 formed in the lighting unit EA, a short reduction pattern SR which implements a narrow path at the outer edge of the second area A2 may be formed.

In some exemplary aspects, in order to suppress the short of the first electrode 115 and the second electrode 117, an insulating layer which is formed on the first electrode 115 on which the auxiliary line and the short reduction pattern SR are formed may be further included.

The insulating layer is disposed between the first electrode 115 and the second electrode 117 to suppress the short of the first electrode 115 and the second electrode 117 due to the damage of the organic layer 116.

Specifically, the insulating layer is configured to cover the short reduction pattern SR formed on the auxiliary line AL and the first electrode 115. As described above, the insulating layer is formed so as to surround the auxiliary line AL to reduce the step due to the auxiliary line AL. Therefore, various layers which are formed on the insulating layer thereafter may be stably formed without being shorted.

Here, the insulating layer may be made of an inorganic material such as silicon oxide SiOx or silicon nitride SiNx. Further, the insulating layer may be configured by an organic layer such as photoacryl (PAC) and also configured by a plurality of layers of inorganic layers and organic layers.

Further, the first contact electrode 115p is formed in the first pad unit PA1 to be electrically connected to the first electrode 115 and the auxiliary line AL. The second contact electrode 117p is formed in the second pad unit so as to be electrically shorted from the first electrode 115 and the auxiliary line AL.

Figure 5I:
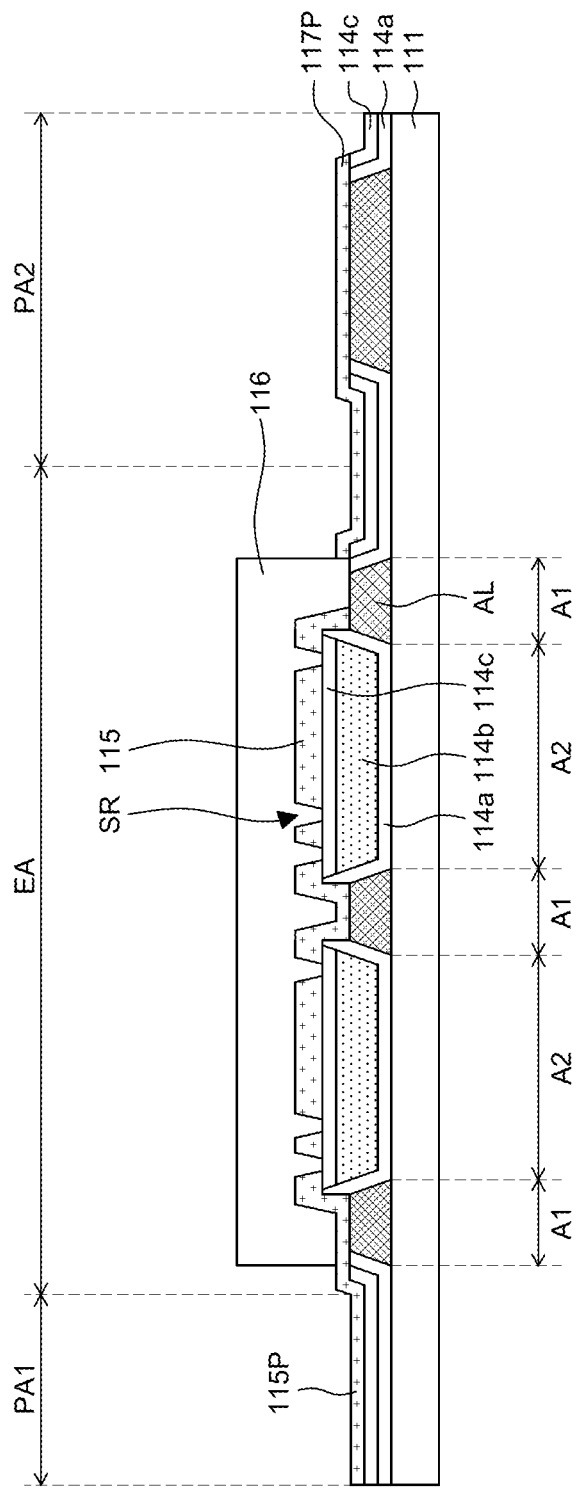

Next, referring to FIG. 5I, a plurality of organic layers 116 is deposited on the first electrode 115. Here, the plurality of organic layers 116 is deposited so as to cover all the first electrode 115 and the auxiliary line AL so that the second contact electrode 117p is electrically shorted from the first electrode 115 and the auxiliary line AL.

In some exemplary aspects, in order to limit a range that the organic layer 116 is deposited and improve a side edge reliability of the deposited organic layer 116, a dam structure may be further formed at the side edge of the organic layer 116 which is deposited on the lighting unit EL to be in contact with the organic layer 116.

The dam structure may be made of an inorganic material such as silicon oxide SiOx or silicon nitride SiNx or an organic material such as photoacryl (PAC) or configured by a plurality of layers of inorganic materials or organic materials to suppress the electrical contact between the first electrode 115 and the second electrode 117.

Figure 5J:
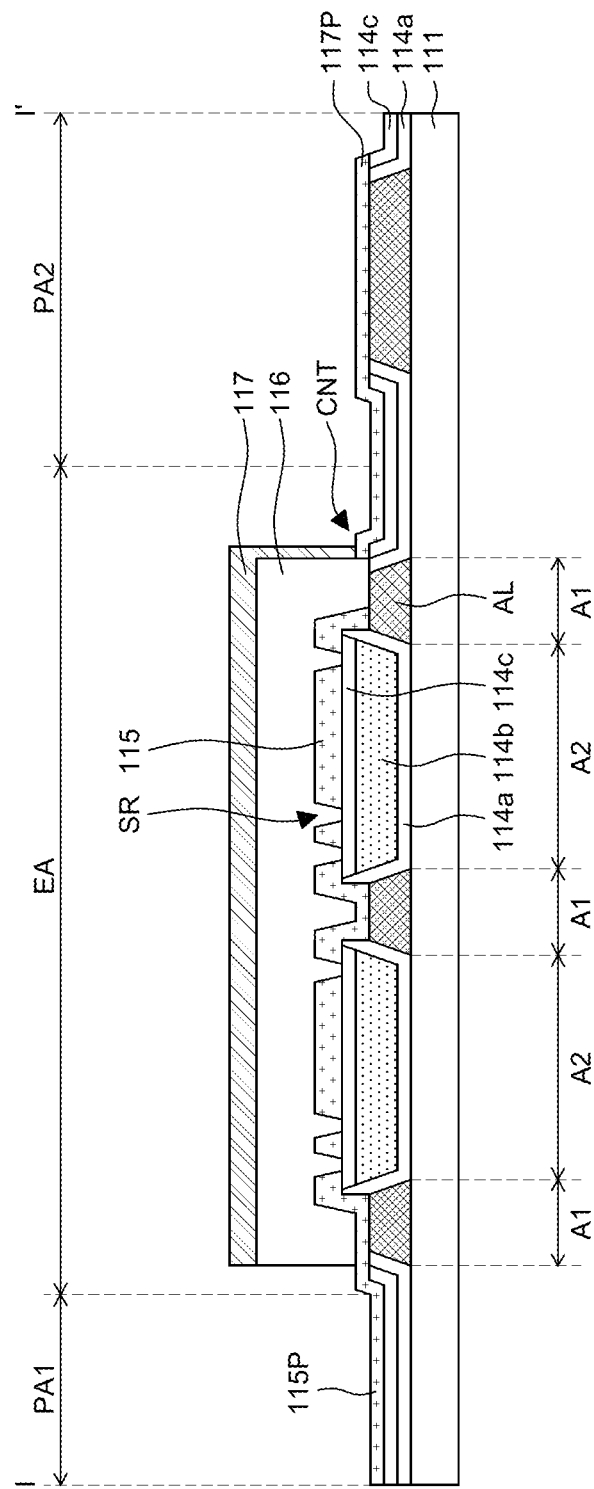

Next, referring to FIG. 5J, the second electrode 117 is deposited so as to cover the plurality of organic layers 116.

Here, the second electrode 117 may be made of metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. Further, the second electrode 117 may be formed as a single stack or also formed as a multi-stack made of the above-mentioned material. One side of the second electrode 117 is formed to be electrically connected to the second contact electrode 117p through the contact portion CNT.

Figure 5K:
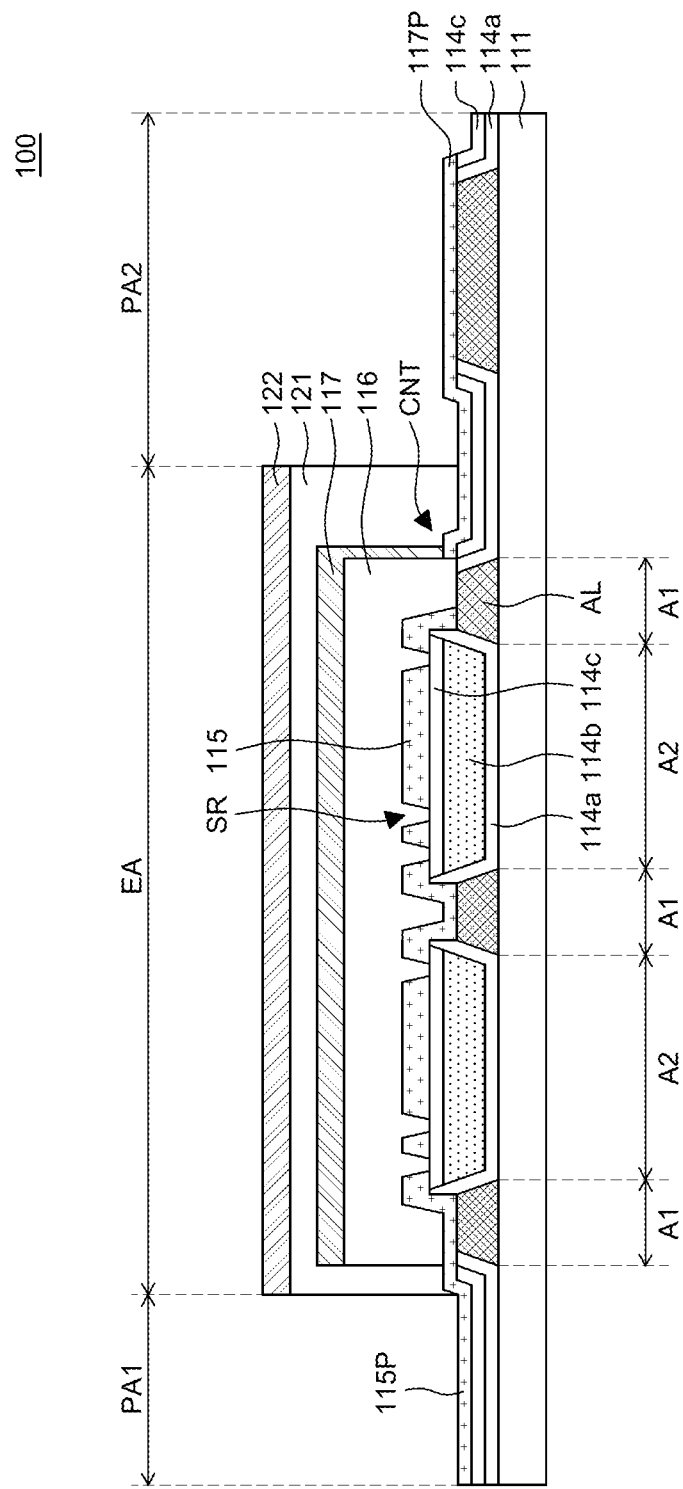

Next, referring to FIG. 5K, on the entire surface of the lighting unit of the substrate 111 excluding the first and second pad units PA1 and PA2, a pressure sensitive adhesive (PSA) layer 121 and the metal film 122 are formed. Further, a pressure is applied to the metal film 122 from the upper portion to the lower portion to bond the metal film 122, thereby completing the lighting apparatus.

As described above, according to the manufacturing method of a lighting apparatus using an organic light emitting diode according to an exemplary aspect of the present disclosure, the first inorganic barrier layer 114a and the second inorganic barrier layer 114c are patterned without using a separate mask process so that the process may be simplified. Further, the auxiliary line AL disposed in the first area A1 and the first inorganic barrier layer 114a and the second inorganic barrier layer 114c disposed in the second area A2 are self-aligned so that the patterns of the auxiliary line AL and the first inorganic barrier layer 114a and the second inorganic barrier layer 114c may be more precisely aligned. Therefore, the accuracy of the process may also be improved.

Hereinafter, a lighting apparatus using an organic light emitting diode according to another exemplary aspect of the present disclosure will be described. A difference between the exemplary aspect of the present disclosure and another exemplary aspect of the present disclosure is an edge shape of the plurality of barrier layers 214a, 214b, and 214c. Therefore, a description of the same part of the exemplary aspect of the present disclosure and another exemplary aspect of the present disclosure is omitted and the edge shape of the plurality of barrier layers 214a, 214b, and 214c will be mainly described.

Figure 6:
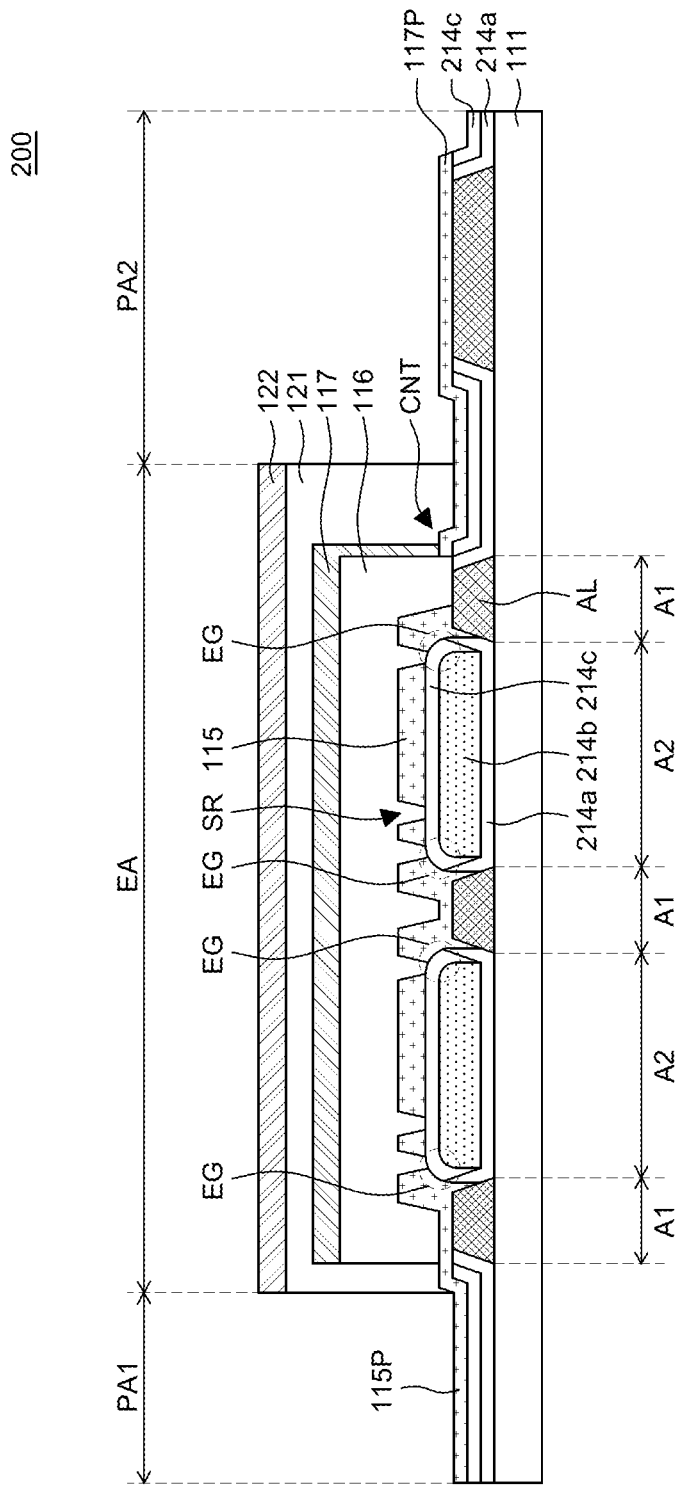
FIG. 6 is a cross-sectional view of a lighting apparatus using an organic light emitting diode according to another exemplary aspect of the present disclosure.

FIG. 6 is a cross-sectional view of a lighting apparatus using an organic light emitting diode according to another exemplary aspect of the present disclosure.

In a lighting apparatus 200 using an organic light emitting diode according to another exemplary aspect of the present disclosure, a plurality of barrier layers 214a, 214b, and 214c has round edges.

Specifically, in an edge area EG of FIG. 6, an edge of the second inorganic barrier layer 214c which abuts on the first electrode 115 has a round shape and an organic barrier layer 214b which abuts on the second inorganic barrier layer 214c having a round edge may also have a round edge.

As described above, according to another exemplary aspect of the present disclosure, the plurality of barrier layers 214a, 214b, and 214c has round edges, so that a contact property of the first electrode 115 and the plurality of barrier layers 214a, 214b, and 214c is improved to suppress the crack of the first electrode 115.

When the crack of the first electrode 115 is suppressed, the reliability of the organic layer 116 which abuts on the first electrode 115 is improved. Therefore, the reliability of the lighting apparatus 200 of another exemplary aspect of the present disclosure may be improved as compared with the exemplary aspect of the present disclosure.

FIGS. 7A to 7K are plan views sequentially illustrating a manufacturing method of a lighting apparatus using an organic light emitting diode according to another exemplary aspect of the present disclosure illustrated in FIG. 6.

Next, a manufacturing method of a lighting apparatus using an organic light emitting diode according to another exemplary aspect of the present disclosure will be described with reference to FIGS. 7A to 7K.

As described above, the difference between the exemplary aspect of the present disclosure and another exemplary aspect of the present disclosure is an edge shape of the plurality of barrier layers 214a, 214b, and 214c. Therefore, a manufacturing method of forming an edge shape of the plurality of barrier layers 214a, 214b, and 214c will be described in detail.

As illustrated in FIGS. 7A to 7D, processes of forming the auxiliary line AL, the photosensitive film pattern PR, and the first inorganic barrier layer 214a on the substrate are the same as the contents of FIGS. 5A to 5D related to the manufacturing method of a lighting apparatus of an organic light emitting diode according to the exemplary aspect of the present disclosure, so that a redundant description will be omitted.

Here, when the first inorganic barrier layer 214a is a thin film formed by a chemical vapor deposition method, the first inorganic barrier layer 214a may be deposited to have a thickness of approximately 1000 to 4000 Å. Further, when the first inorganic barrier layer is a film formed by an atomic layer deposition process, the first inorganic barrier layer may be deposited to have a thickness of approximately 300 to 500 Å. However, the thickness may be reduced or increased to a predetermined level depending on the process or the environment.

Figure 7A:
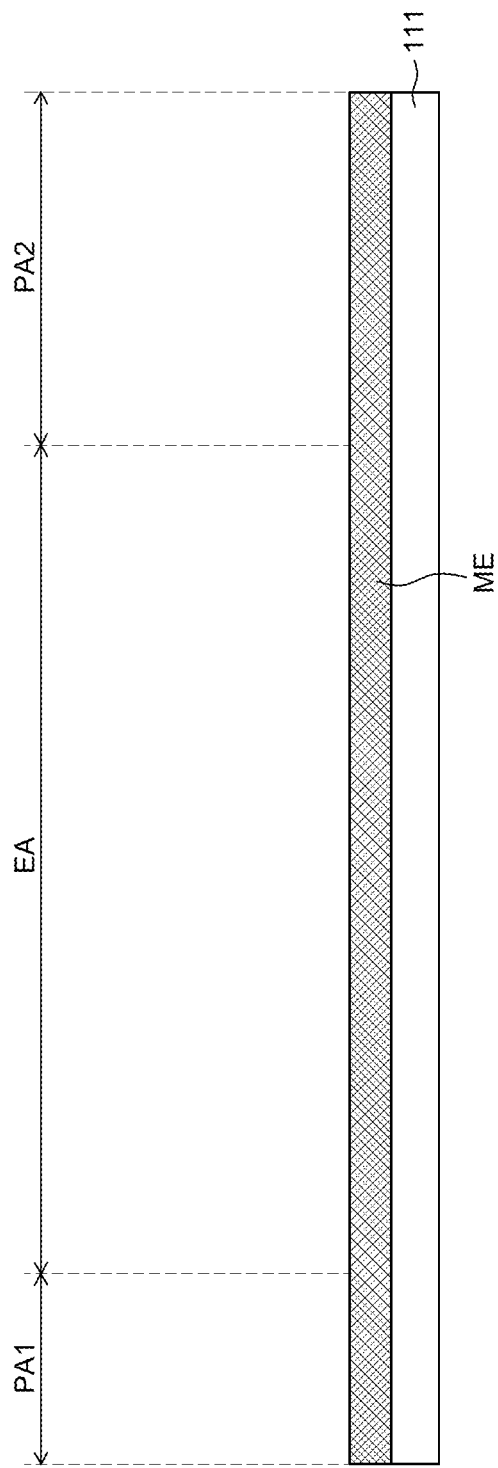
FIGS. 7A to 7K are plan views sequentially illustrating a manufacturing method of a lighting apparatus using an organic light emitting diode according to another exemplary aspect of the present disclosure illustrated in FIG. 6.
Figure 7B:
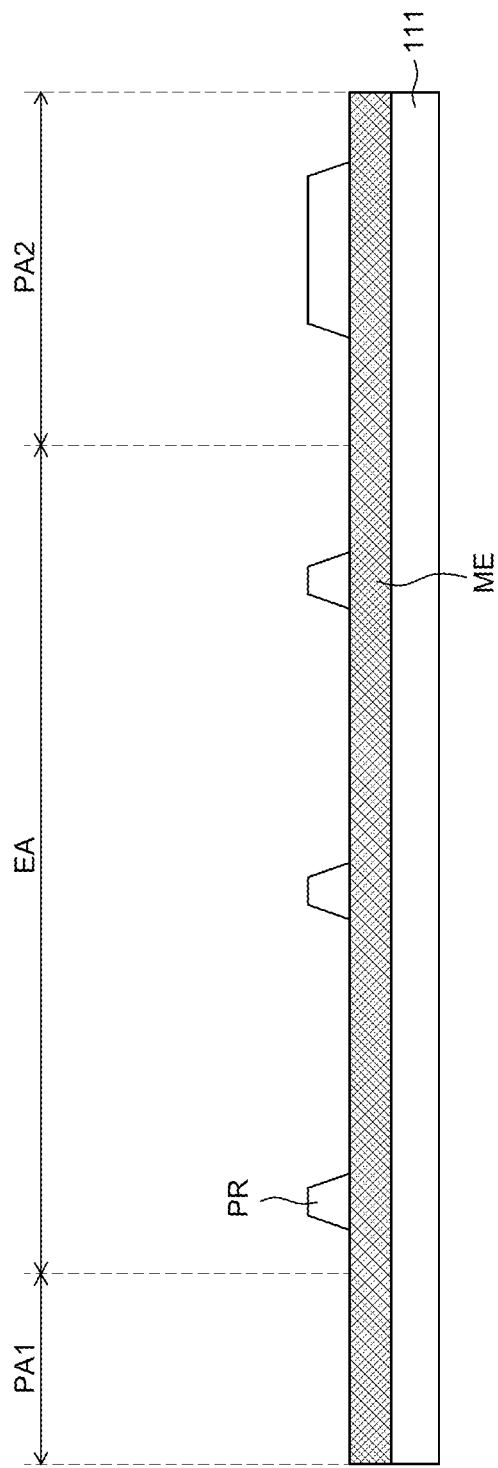
Figure 7C:
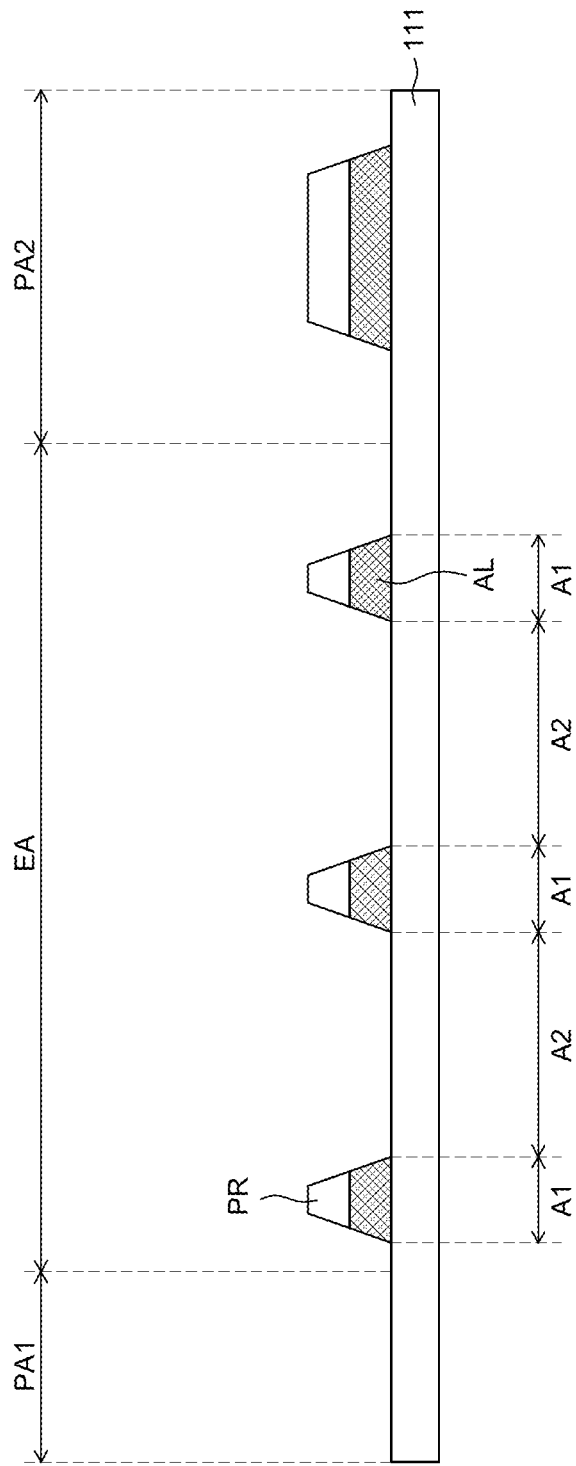
Figure 7D:
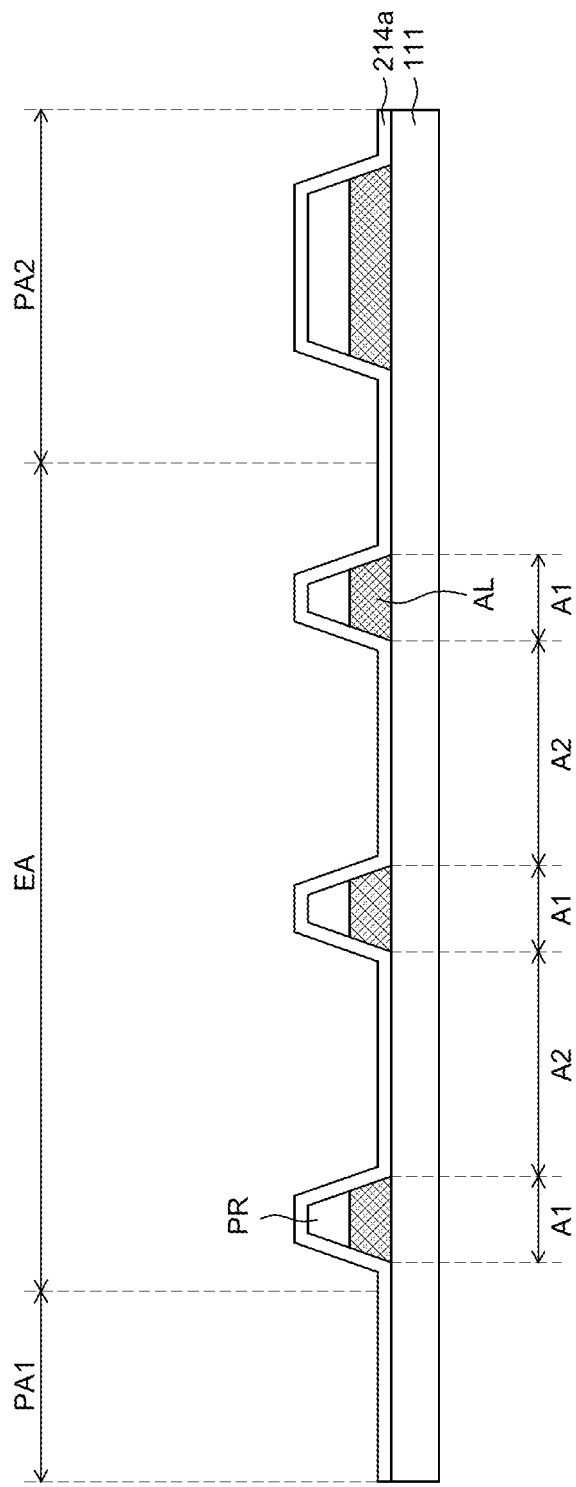
Figure 7E:
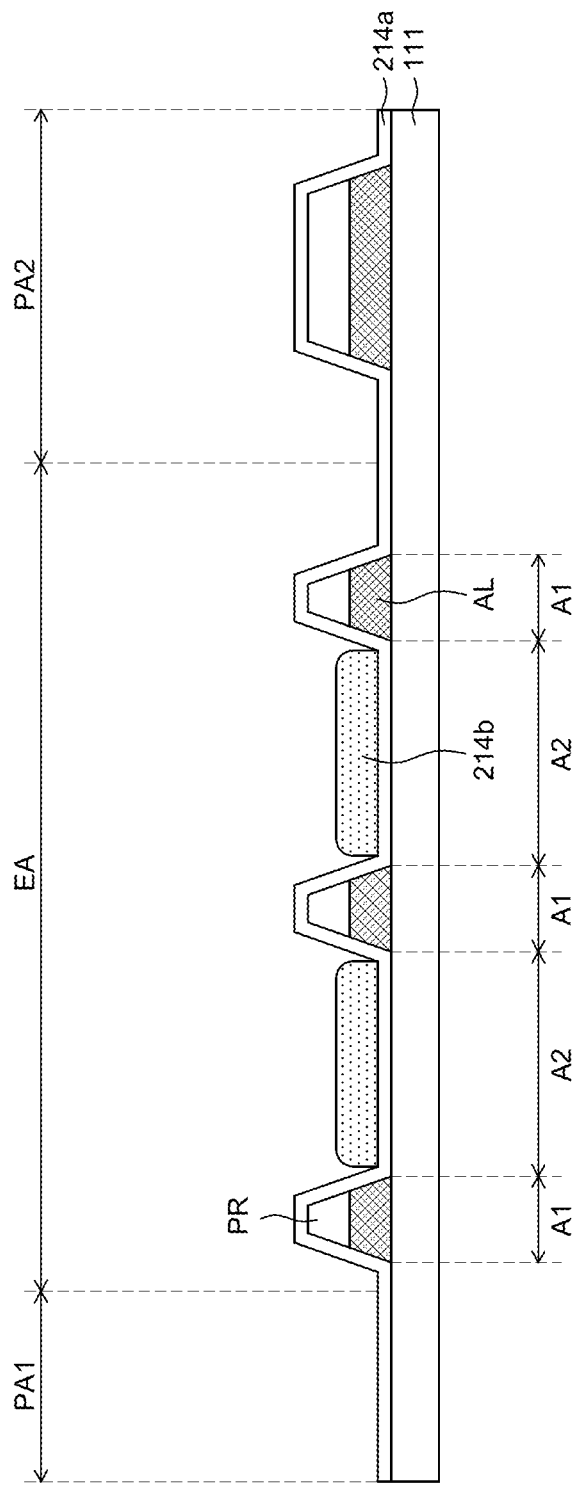

Next, referring to FIG. 7E, an organic barrier layer 214b is coated in the second area A2 on the substrate 111 on which the first inorganic barrier layer 214a is deposited. When the coating method is used, only a desired area may remain using a photo process after coating the entire surface using slit coating method or only an organic film may be formed only in a desired area using an inkjet-coating method.

Here, the organic barrier layer 214b may be made of acrylic resin or epoxy resin, and specifically, may be made of photoacryl (PAC).

Further, the edge of the organic barrier layer 214b in another exemplary aspect of the present disclosure may have a round shape.

As described above, the organic barrier layer 214b may be formed to have a thickness of 1 to 5 μm using an inkjet process or a slit coater process and a thickness may be reduced or increased to a predetermined level depending on the process or the environment.

Figure 7F:
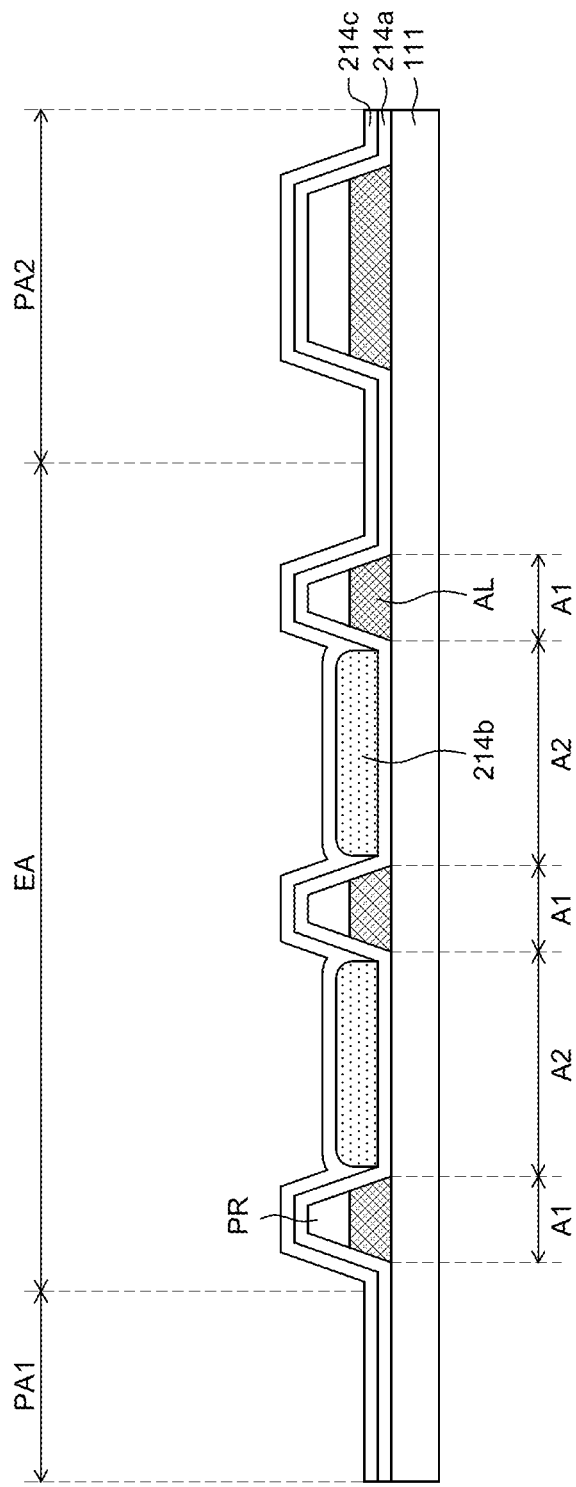

Next, referring to FIG. 7F, the second inorganic barrier layer 214c is deposited on the entire surface of the substrate 111 on which the organic barrier layer 214b is deposited. Here, the second inorganic barrier layer 214c may be formed by the atomic layer deposition method like the deposition of the first inorganic barrier layer 214a, but it is not limited thereto and various deposition methods such as a physics vapor deposition method and a chemical vapor deposition method may be used.

Here, the second inorganic barrier layer 214c may be made of one of Al2O3, ZrO2, HfO2, TiO2, ZnO, Y2O3, CeO2, Ta2O5, La2O5, Nb2O5, SiO2, and SiNx.

When the second inorganic barrier layer 214c is a thin film formed by a chemical vapor deposition method, the second inorganic barrier layer 214c may be deposited to have a thickness of approximately 1000 to 4000 Å. Further, when the second inorganic barrier layer is a film formed by an atomic layer deposition process, the second inorganic barrier layer may be deposited to have a thickness of approximately 300 to 500 Å. However, the thickness may be reduced or increased to a predetermined level depending on the process or the environment.

According to another exemplary aspect of the present disclosure, the edge of the organic barrier layer 214b has a round shape, so that the second inorganic barrier layer 214c may also include a round edge in accordance with a shape of the organic barrier layer 214b including a round edge.

Figure 7G:
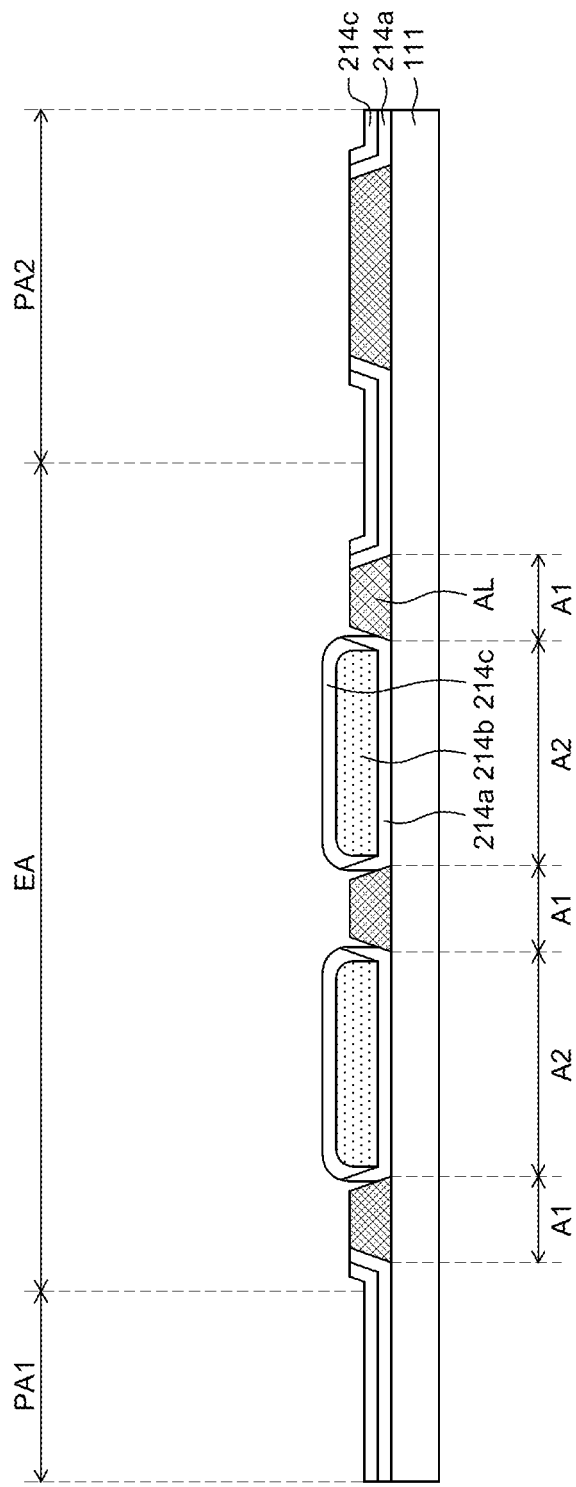

Next, as illustrated in FIG. 7G, the photosensitive film pattern PR disposed in the first area A1 is removed to lift-off the first inorganic barrier layer 214a and the second inorganic barrier layer 214c deposited on the photosensitive film pattern PR.

Figure 7H:
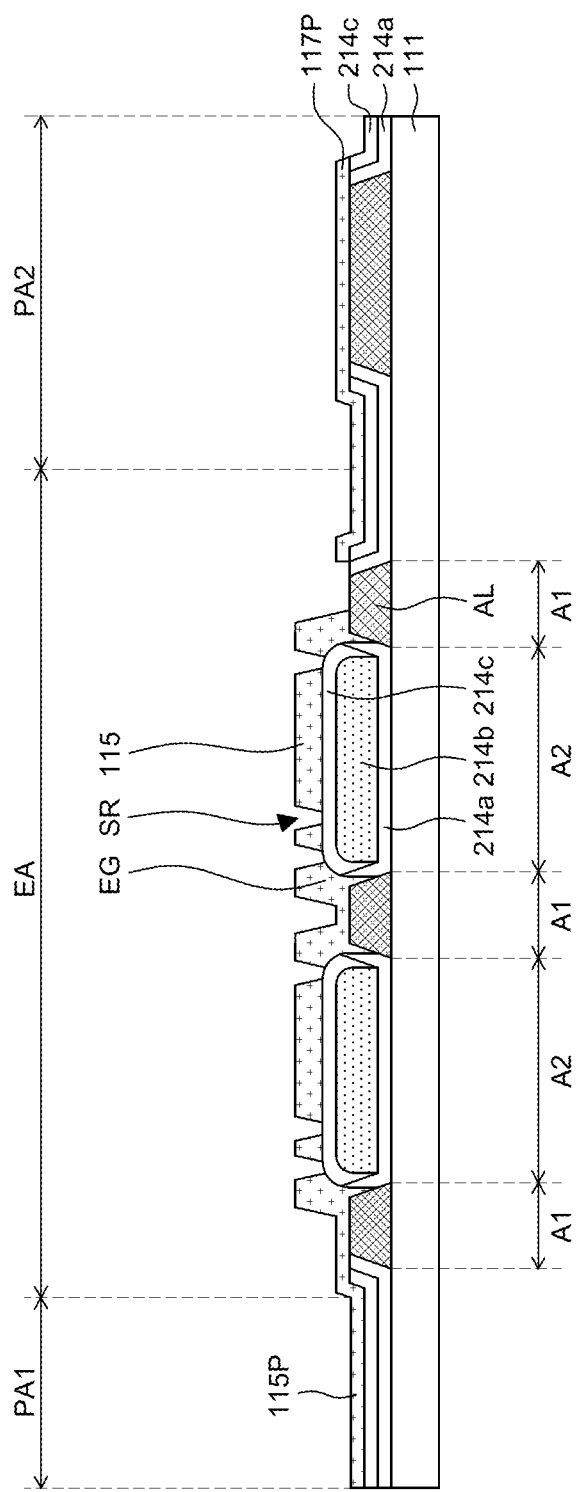

Next, as illustrated in FIG. 7H, a first electrode 115 including a short reduction pattern SR is formed on the entire surface of the substrate on which the auxiliary line A1 and the plurality of barrier layers 214a, 214b, and 214c are formed. The first contact electrode 115p is formed in the first pad unit PA1 so as to be electrically connected to the first electrode 115 and the auxiliary line AL. Further, the second contact electrode 117p is formed in the second pad unit so as to be electrically shorted from the first electrode 115 and the auxiliary line AL.

Figure 7I:
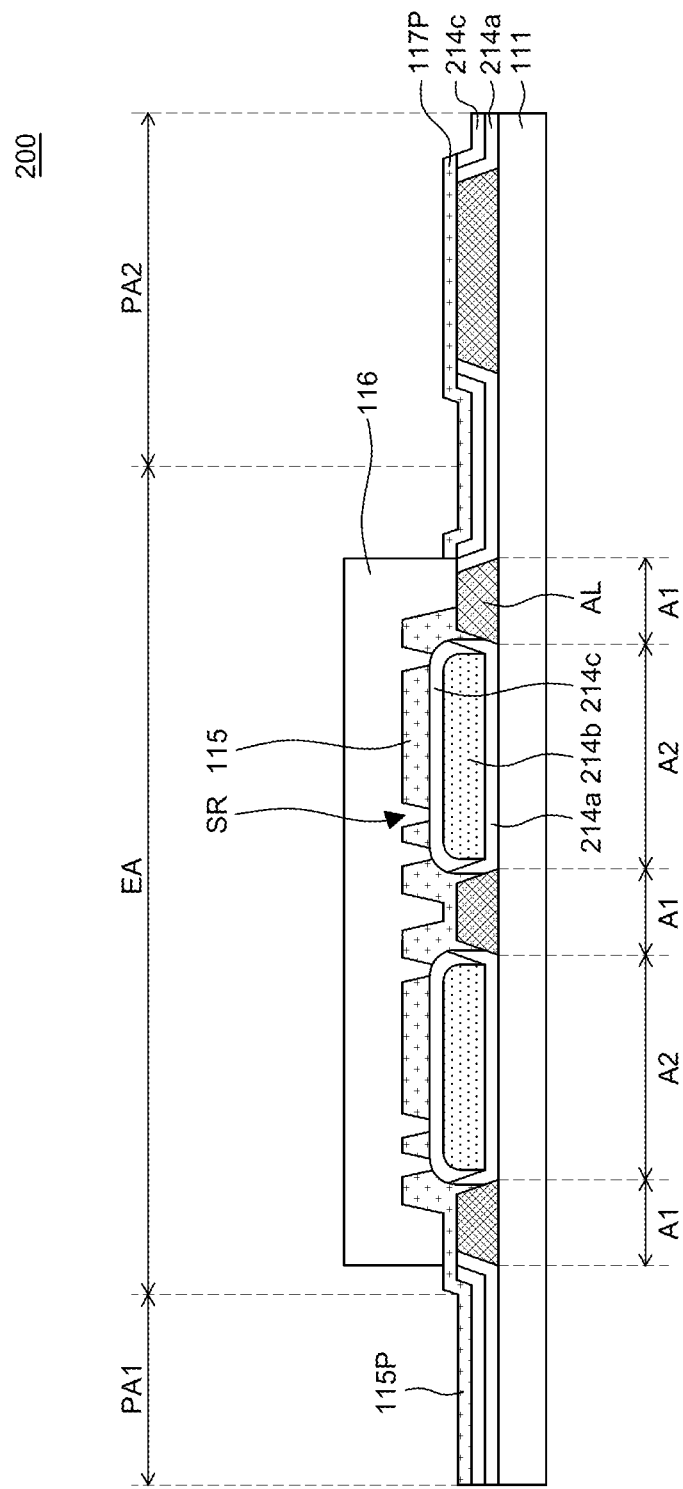

Next, referring to FIG. 7I, a plurality of organic layers 116 is deposited on the first electrode 115. Here, the plurality of organic layers 116 is deposited so as to cover all the first electrode 115 and the auxiliary line AL so that the second contact electrode 117p is electrically shorted from the first electrode 115 and the auxiliary line AL.

Figure 7J:
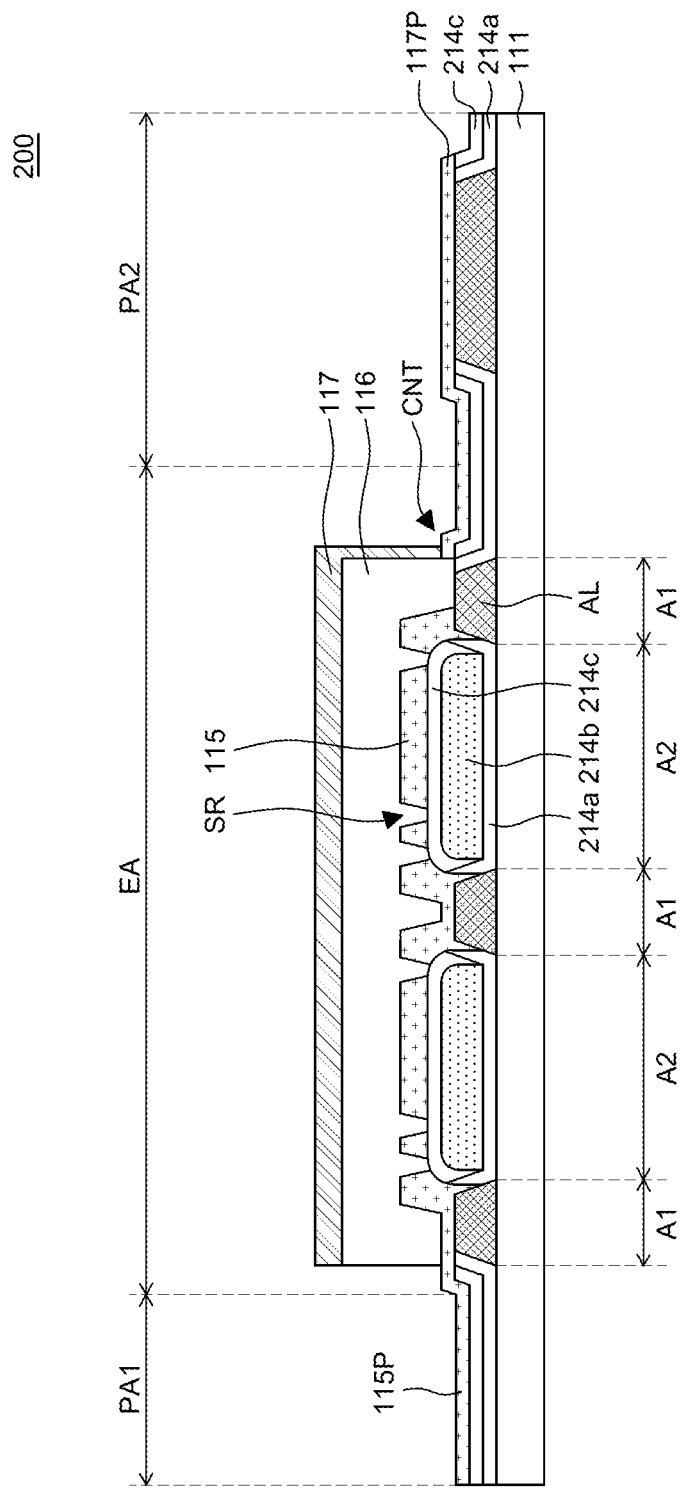

Next, referring to FIG. 7J, the second electrode 117 is deposited so as to cover the plurality of organic layers 116.

Figure 7K:
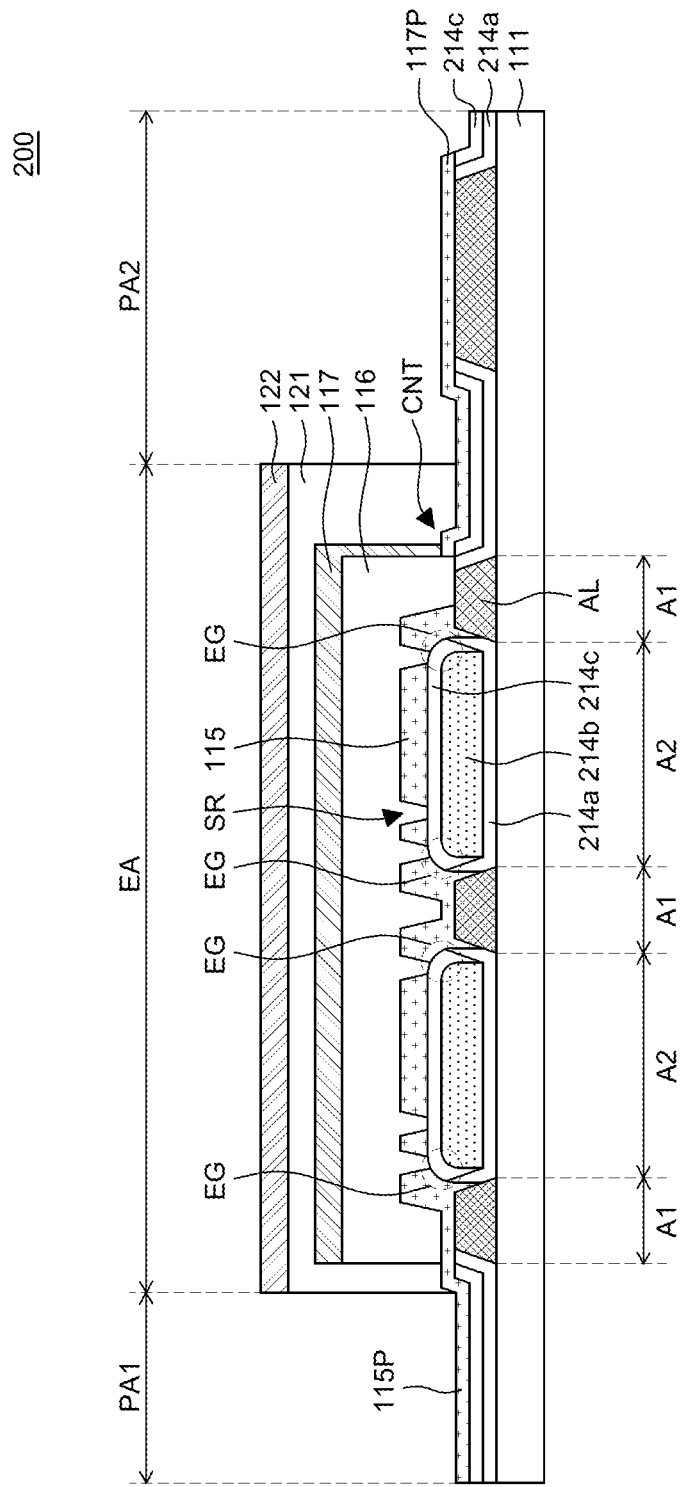

Next, referring to FIG. 7K, on the entire surface of the lighting unit of the substrate 111 excluding the first and second pad units PA1 and PA2, a pressure sensitive adhesive (PSA) layer 121 and the metal film 122 are formed. Further, a pressure is applied to the metal film 122 from the upper portion to the lower portion to bond the metal film 122, thereby completing the lighting apparatus.

As described above, according to another exemplary aspect of the present disclosure, as seen from the edge area EG, the plurality of barrier layers 214a, 214b, and 214c is manufactured to have round edges, so that a contact property of the first electrode 115 and the plurality of barrier layers 214a, 214b, and 214c is improved to suppress the crack of the first electrode 115.

When the crack of the first electrode 115 is suppressed, the reliability of the organic layer 116 which abuts on the first electrode 115 is improved so that the reliability of the lighting apparatus 200 of another exemplary aspect of the present disclosure may be improved as compared with the exemplary aspect of the present disclosure.

The exemplary aspects of the present disclosure can also be described as follows:

According to an aspect of the present disclosure, a lighting apparatus using an organic light emitting diode is divided into a first area and a second area and includes: a substrate; an auxiliary line disposed in a first area on the substrate; a plurality of barrier layers disposed in a second area on the substrate; a first electrode disposed on an entire surface of the substrate on which the auxiliary line and the plurality of barrier layers are disposed; and an organic layer disposed on the first electrode and a second electrode disposed on the organic layer. Therefore, the reliability of the lighting apparatus may be improved.

The first inorganic barrier layer and the second inorganic barrier layer may surround the organic barrier layer.

A thickness of the organic barrier layer may be thicker than a thickness of any one of the first inorganic barrier layer and the second inorganic barrier layer.

The organic barrier layer may be made of photoacryl (PAC).

The organic barrier layer and the second inorganic barrier layer may include round edges.

A sum of thicknesses of the plurality of barrier layers may be thicker than a thickness of the auxiliary line.

The first electrode may include a short reduction pattern which implements a narrow path at an outer edge of the second area.

The first area may be a non-emission area and the second area is an emission area.

The auxiliary line disposed in the first area may be exposed by a lift-off process.

The lighting apparatus using an organic light emitting diode may further comprise a first contact electrode which is electrically connected to the first electrode and is exposed to the outside in a first pad unit, and a second contact electrode which is electrically connected to the second electrode and is exposed to the outside in a second pad unit.

According to another aspect of the present disclosure, a manufacturing method of a lighting apparatus using an organic light emitting diode includes: providing a substrate which is divided into a first area and a second area; forming an auxiliary line and a photosensitive film pattern in the first area on the substrate; depositing a first inorganic barrier layer on an entire surface of the substrate on which the auxiliary line and the photosensitive film pattern are formed; coating an organic barrier layer in the second area on the substrate on which the first inorganic barrier layer is deposited; depositing a second inorganic barrier layer on an entire surface of the substrate on which the organic barrier layer is coated; lifting-off the first inorganic barrier layer and the second inorganic barrier layer deposited on the photosensitive film pattern by removing the photosensitive film pattern disposed in the first area; forming a first electrode on an entire surface of the substrate on which the auxiliary line, the first inorganic barrier layer, the organic barrier layer, and the second inorganic barrier layer are disposed so as to be in contact with the auxiliary line exposed in the first area; depositing an organic layer on an entire surface of the substrate on which the first electrode is formed; and depositing a second electrode on an entire surface of the substrate on which the organic layer is formed. Therefore, a separate process for disposing the plurality of barrier layers only in the second area is not necessary so that the manufacturing process may be simplified.

the forming of an auxiliary line and a photosensitive film pattern may include depositing a metal layer on the entire surface of the substrate; forming the photosensitive film pattern in the first area of the substrate on which the metal layer is deposited; and etching the metal layer deposited in the second area of the substrate using the photosensitive film pattern as a mask.

In the depositing of the first inorganic barrier layer and the second inorganic barrier layer, the first inorganic barrier layer and the second inorganic barrier layer may be deposited by an atomic layer deposition (ALD) method.

In the lifting-off of the first inorganic barrier layer and the second inorganic barrier layer, intense pulsed light (IPL) may be irradiated onto the photosensitive film pattern to remove the photosensitive film pattern.

In the lifting-off of the first inorganic barrier layer and the second inorganic barrier layer, a photolysis catalyst may be added to the photosensitive film pattern and ultraviolet ray may be irradiated onto the photosensitive film pattern to activate the photolysis catalyst and remove the photosensitive film pattern.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus using an organic light emitting diode that has a first area and a second area, the lighting apparatus comprising:
    a substrate;
    an auxiliary line disposed in the first area on the substrate;
    a plurality of barrier layers disposed in the second area on the substrate;
    a first electrode disposed on the auxiliary line and the plurality of barrier layers;
    an organic layer disposed on the first electrode; and
    a second electrode disposed on the organic layer,
    wherein the first electrode includes a short reduction pattern which implements a narrow path at an outer edge of the second area.

2. The lighting apparatus using an organic light emitting diode according to claim 1, wherein the plurality of barrier layers includes a first inorganic barrier layer, an organic barrier layer, and a second inorganic barrier layer which are sequentially laminated.

3. The lighting apparatus using an organic light emitting diode according to claim 2, wherein the first inorganic barrier layer and the second inorganic barrier layer surround the organic barrier layer.

4. The lighting apparatus using an organic light emitting diode according to claim 2, wherein a thickness of the organic barrier layer is greater than a thickness of the first inorganic barrier layer and the second inorganic barrier layer.

5. The lighting apparatus using an organic light emitting diode according to claim 2, wherein the organic barrier layer is made of photoacryl (PAC).

6. The lighting apparatus using an organic light emitting diode according to claim 2, wherein the organic barrier layer and the second inorganic barrier layer have round edges.

7. The lighting apparatus using an organic light emitting diode according to claim 1, wherein a sum of thicknesses of the plurality of barrier layers is greater than a thickness of the auxiliary line.

8. The lighting apparatus using an organic light emitting diode according to claim 1, wherein the first area is a non-emission area and the second area is an emission area.

9. The lighting apparatus using an organic light emitting diode according to claim 1, wherein the auxiliary line disposed in the first area is exposed by a lift-off process.

10. The lighting apparatus using an organic light emitting diode according to claim 1, further comprising:
 a first contact electrode which is electrically connected to the first electrode and is exposed to an outside in a first pad unit, and
 a second contact electrode which is electrically connected to the second electrode and is exposed to the outside in a second pad unit.

11. A lighting apparatus using an organic light emitting diode that has an emission area and a non-emission area, the lighting apparatus comprising:
 a substrate;
 an auxiliary line disposed in the non-emission area on the substrate;
 a plurality of barrier layers disposed in the emission area on the substrate;
 a first electrode disposed on the auxiliary line and the plurality of barrier layers, wherein the first electrode include a short reduction pattern to surround an outer edge of the emission area;
 an organic layer disposed on the first electrode; and
 a second electrode disposed on the organic layer.

12. The lighting apparatus using an organic light emitting diode according to claim 11, wherein the plurality of barrier layers includes a first inorganic barrier layer, an organic barrier layer, and a second inorganic barrier layer which are sequentially stacked, and
 wherein the organic barrier layer and the second inorganic barrier layer have round edges.

* * * * *